(12) United States Patent
Nozawa et al.

(10) Patent No.: US 11,282,699 B2
(45) Date of Patent: Mar. 22, 2022

(54) SUBSTRATE PROCESSING APPARATUS

(71) Applicant: TOKYO ELECTRON LIMITED, Tokyo (JP)

(72) Inventors: Syuji Nozawa, Nirasaki (JP); Tatsuya Yamaguchi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 73 days.

(21) Appl. No.: 16/814,694

(22) Filed: Mar. 10, 2020

(65) Prior Publication Data
US 2020/0294797 A1  Sep. 17, 2020

(30) Foreign Application Priority Data
Mar. 12, 2019  (JP) .............................. JP2019-045178

(51) Int. Cl.
H01L 21/02  (2006.01)
B05D 1/00  (2006.01)
H01L 21/67  (2006.01)

(52) U.S. Cl.
CPC .......... H01L 21/02118 (2013.01); B05D 1/60 (2013.01); H01L 21/02354 (2013.01); H01L 21/67028 (2013.01); H01L 21/67115 (2013.01)

(58) Field of Classification Search
None
See application file for complete search history.

(56) References Cited

U.S. PATENT DOCUMENTS

2016/0189974 A1* 6/2016 Shiozawa ......... H01L 21/02318
                                                                438/781
2019/0148179 A1* 5/2019 Kikai .................... B08B 7/0057
                                                                134/1.3

FOREIGN PATENT DOCUMENTS

JP  H10-289903 A  10/1998
JP  2018-98220 A  6/2018

* cited by examiner

*Primary Examiner* — Dung A. Le
(74) *Attorney, Agent, or Firm* — Nath, Goldberg & Meyer; Jerald L. Meyer; Tanya E. Harkins

(57) ABSTRACT

There is provided a substrate processing apparatus including: a processing container having a vacuum atmosphere formed therein; a stage provided within the processing container and configured to place a substrate on the stage; a film-forming gas supply part configured to supply a film-forming gas for forming an organic film on the substrate placed on the stage; and a heating part configured to heat the substrate placed on the stage in a non-contact manner so as to remove a surface portion of the organic film.

15 Claims, 17 Drawing Sheets

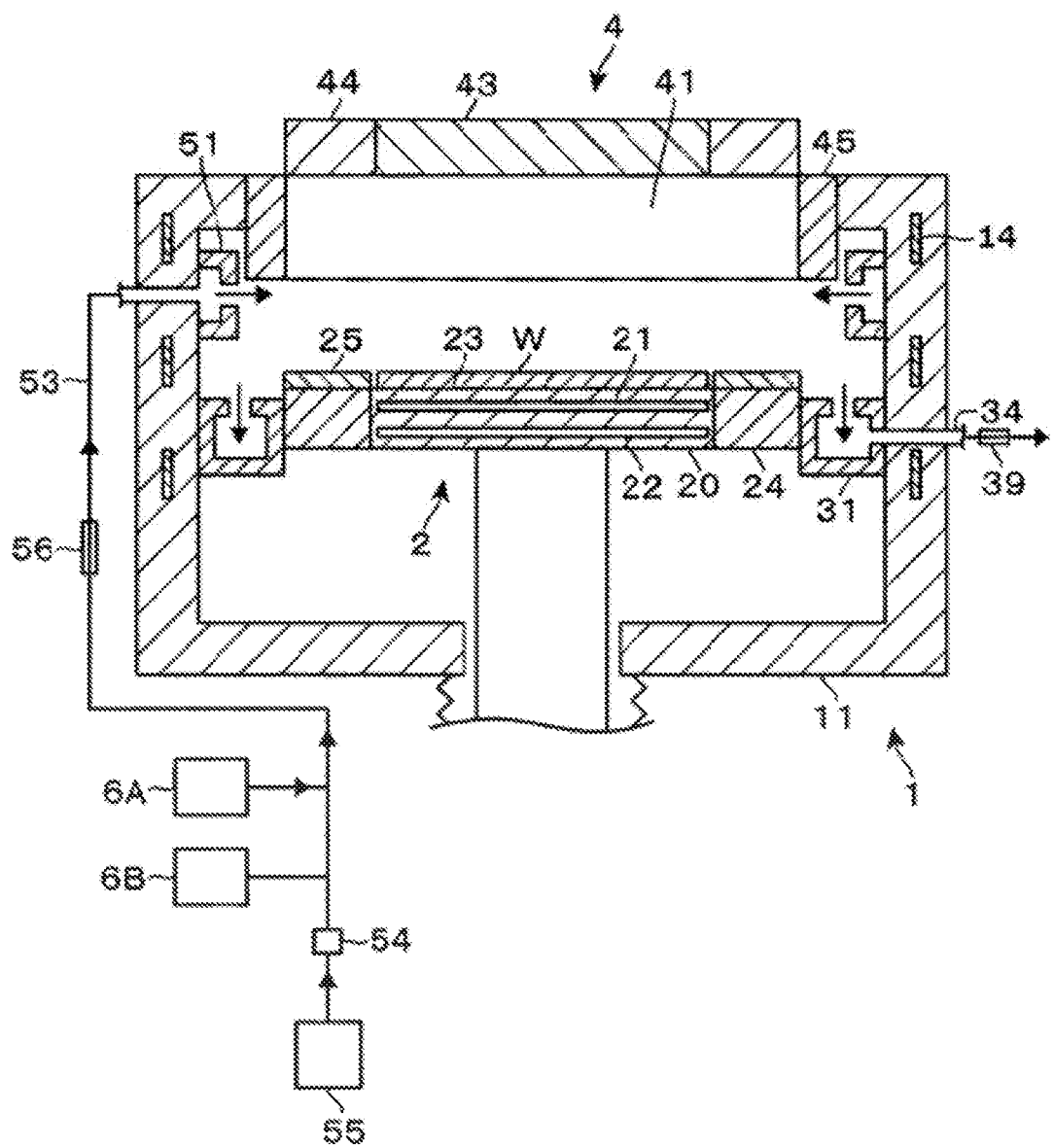

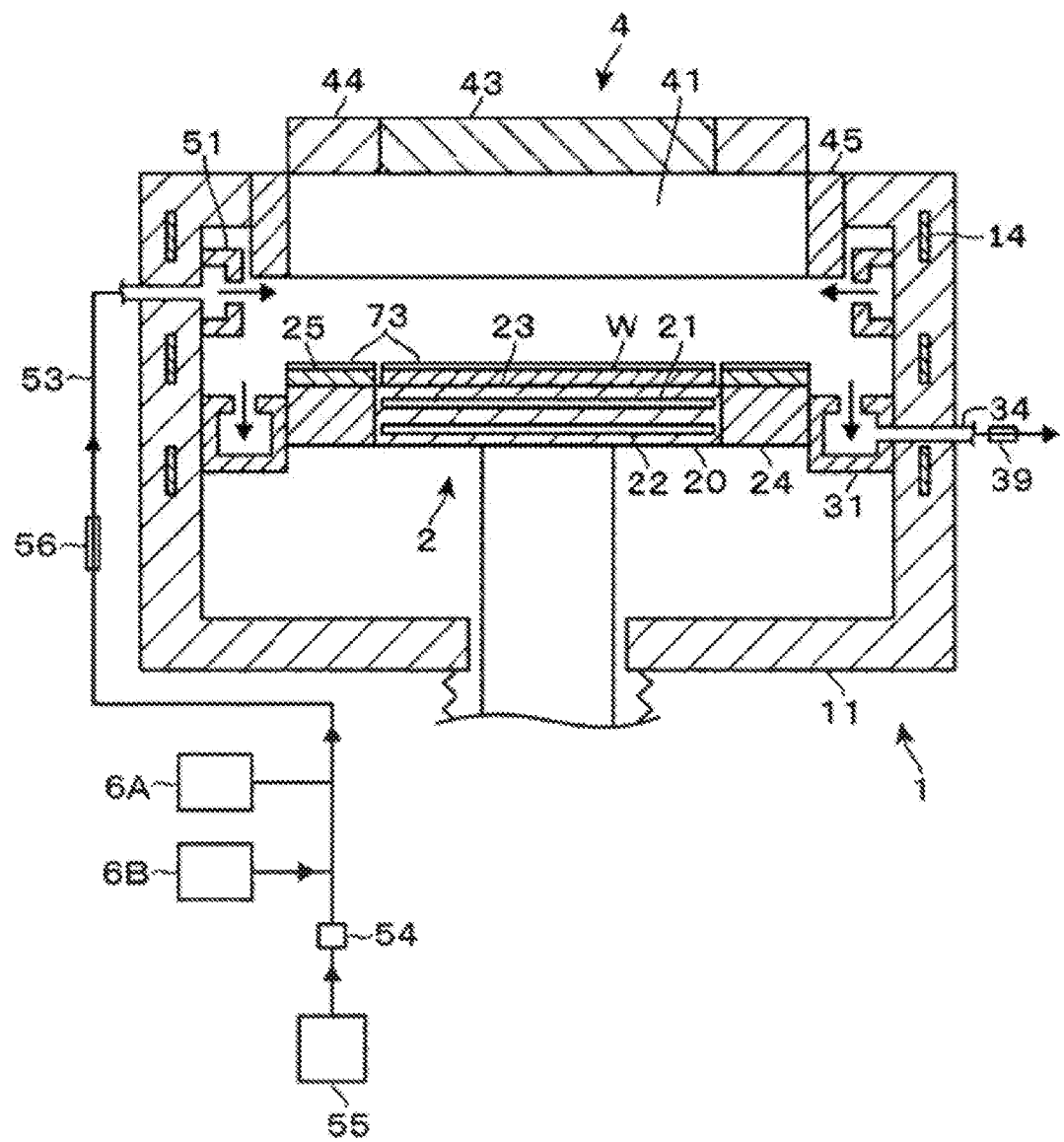

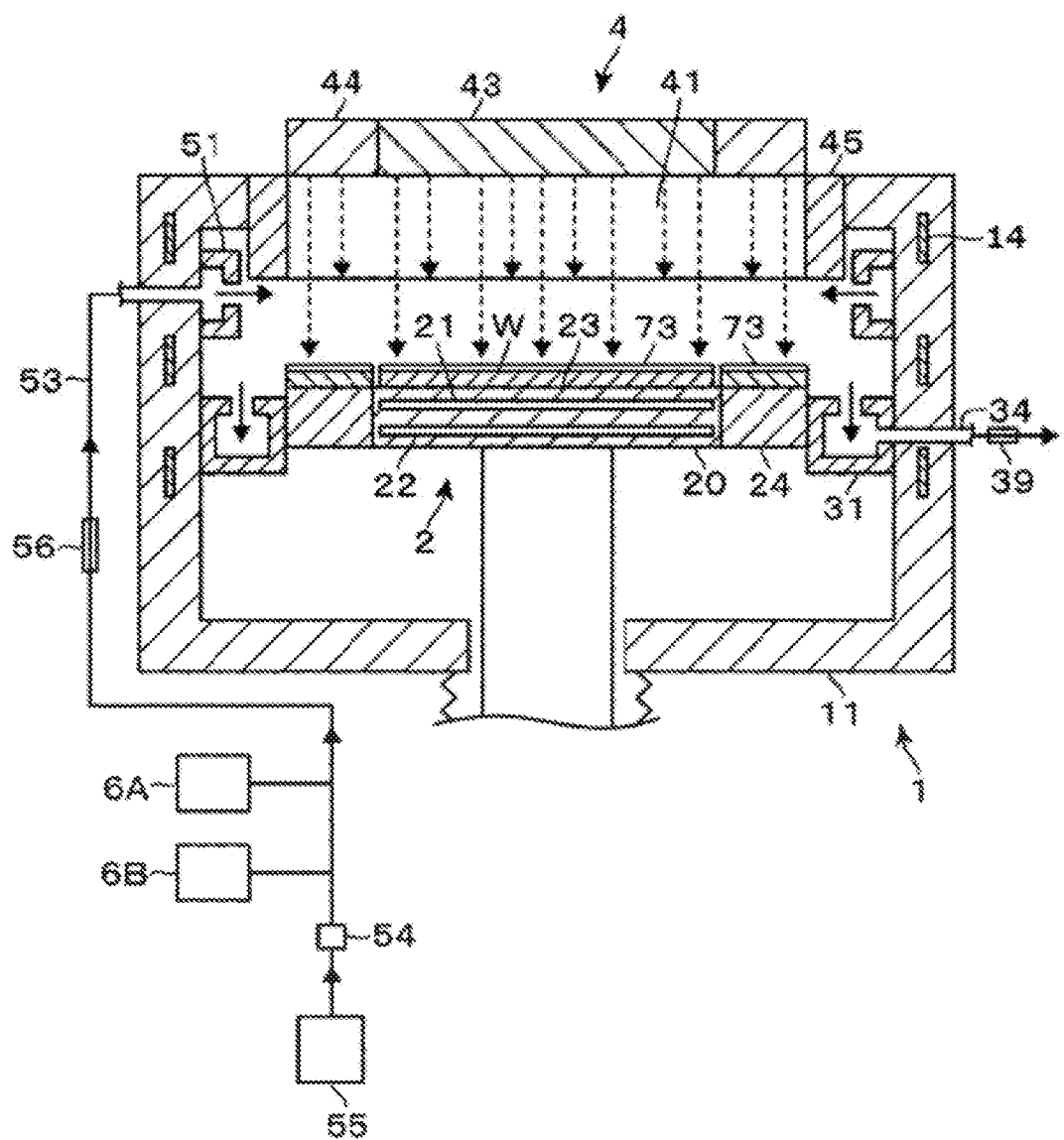

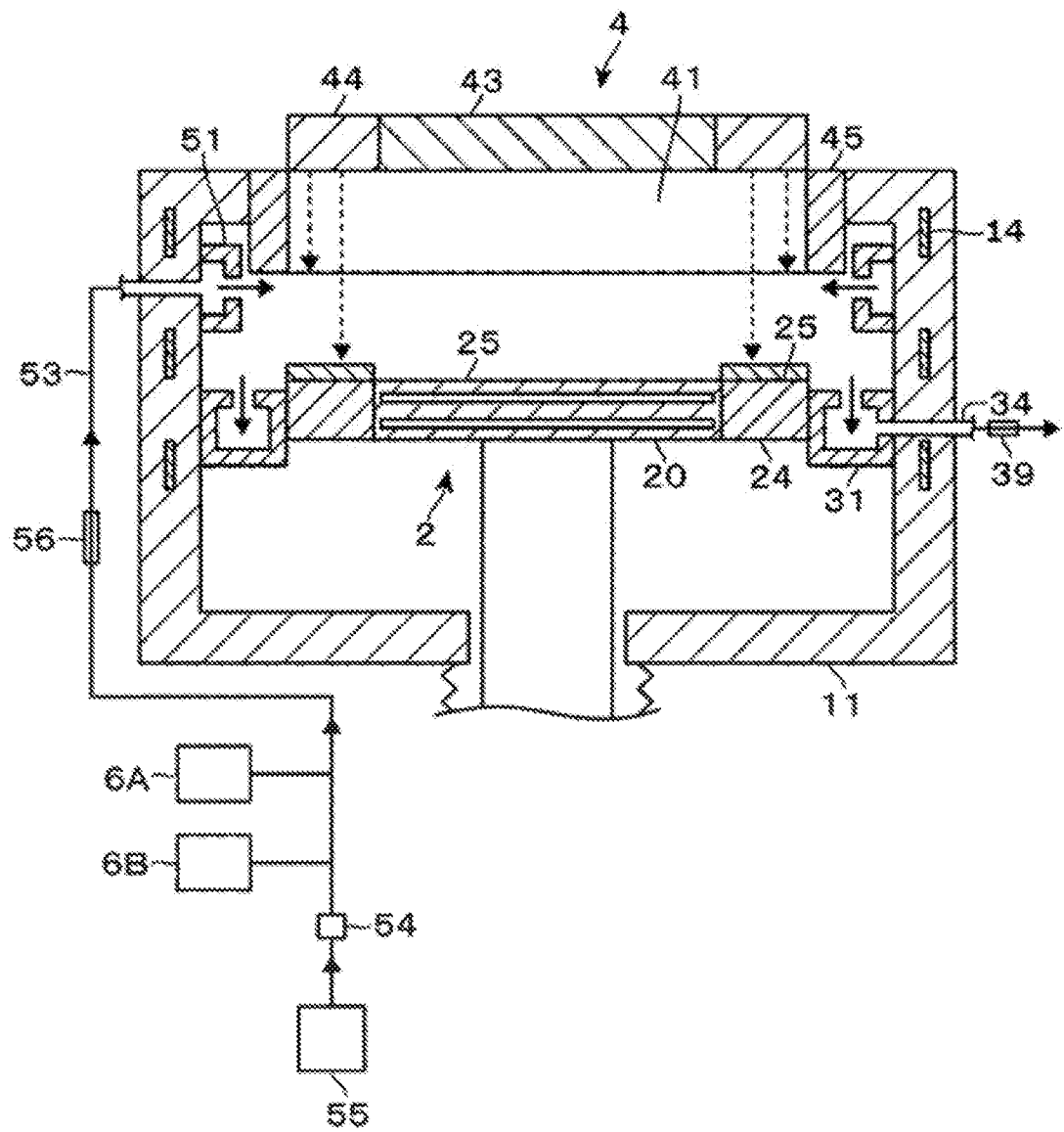

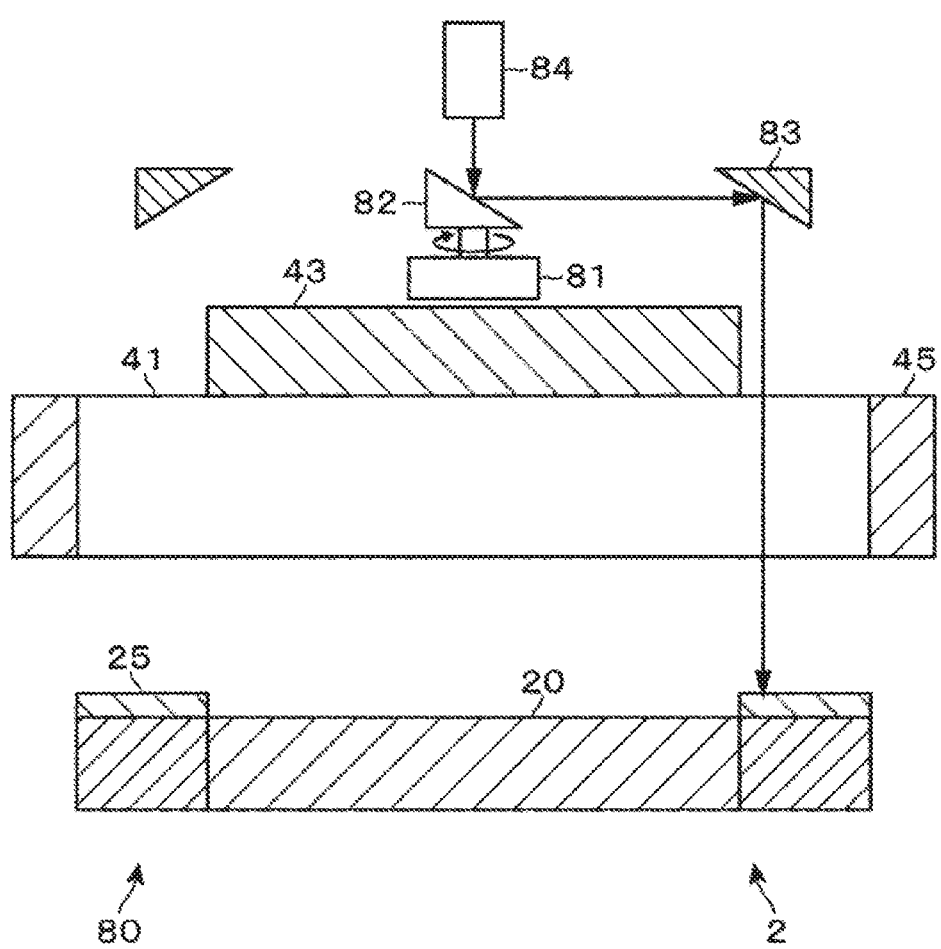

SUBSTRATE PROCESSING APPARATUS

CROSS-REFERENCE TO RELATED APPLICATION

This application is based upon and claims the benefit of priority from Japanese Patent Application No. 2019-045178, filed on Mar. 12, 2019, the entire contents of which are incorporated herein by reference.

TECHNICAL FIELD

The present disclosure relates to a substrate processing apparatus and a substrate processing method.

BACKGROUND

In a semiconductor device manufacturing process, there may be a case where an organic film as a polymer may be formed or etched on a semiconductor wafer (hereinafter, referred to as a "wafer") as a substrate. Patent Document 1 discloses a process of supplying each of a diamine gas and a diisocyanate gas onto an insulating film of a wafer to form a polyurea film as a polymer, and subsequently forming a mask pattern on the polyurea film by etching. The insulating film is etched using the polyurea film as a mask. Thereafter, the polyurea film is removed by irradiating the wafer with infrared rays to heat the wafer and cutting the urea bonds in the polyurea film, namely depolymerizing the polyurea.

In Patent Document 2, after a polyurea film is formed on a wafer, the wafer is placed on a stage provided with a heater and is subjected to a heat treatment so as to produce a polycarbodiimide film from the polyurea film. As processing for changing the heat resistance of the polycarbodiimide film, the film is irradiated with ultraviolet rays before the above heat treatment.

PRIOR ART DOCUMENT

Patent Document

Patent Document 1: Japanese Laid-Open Patent Publication No. 2018-098220
Patent Document 2: Japanese Laid-Open Patent Publication No. H10-289903

SUMMARY

According to an embodiment of the present disclosure, there is provided a substrate processing apparatus including: a processing container having a vacuum atmosphere formed therein; a stage provided within the processing container and configured to place a substrate on the stage; a film-forming gas supply part configured to supply a film-forming gas for forming an organic film on the substrate placed on the stage; and a heating part configured to heat the substrate placed on the stage in a non-contact manner so as to remove a surface portion of the organic film.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 4 is an explanatory view illustrating an operation of the substrate processing apparatus.
FIG. 5 is an explanatory view illustrating an operation of the substrate processing apparatus.
FIG. 6 is an explanatory view illustrating an operation of the substrate processing apparatus.
FIG. 7 is an explanatory view illustrating an operation of the substrate processing apparatus.
FIG. 10 is a view schematically illustrating a first modification of the substrate processing apparatus.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A substrate processing apparatus 1 according to an embodiment of the present disclosure will be described. The substrate processing apparatus 1 is configured to perform a film forming process in which a film-forming gas is supplied onto a wafer W to form a polyurea film as a polymer containing urea bonds, and an annealing process in which light is irradiated onto the wafer W to heat the wafer W and a surface portion of the polyurea film is depolymerized and removed. The film-forming process of forming the polyurea film is performed by vapor deposition polymerization of two kinds of film-forming gases. Assuming that a cycle including the film-forming process and the annealing process following the film-forming process is one processing cycle, the processing cycle is repeated multiple times so as to process one sheet of water W. More specifically, a film is formed on a wafer W in which a concave portion (recess) is formed so that the film is buried in the concave portion. A surface portion of the film is limitedly removed so as to form another recess again. Subsequently, the film is buried in the another recess again. In this manner, a shape of the buried film is controlled. In addition, the substrate processing apparatus 1 is configured to perform, after the processing of the wafer W, a cleaning process of removing the polyurea film on a peripheral portion of a stage to be described later.

Figure 1:
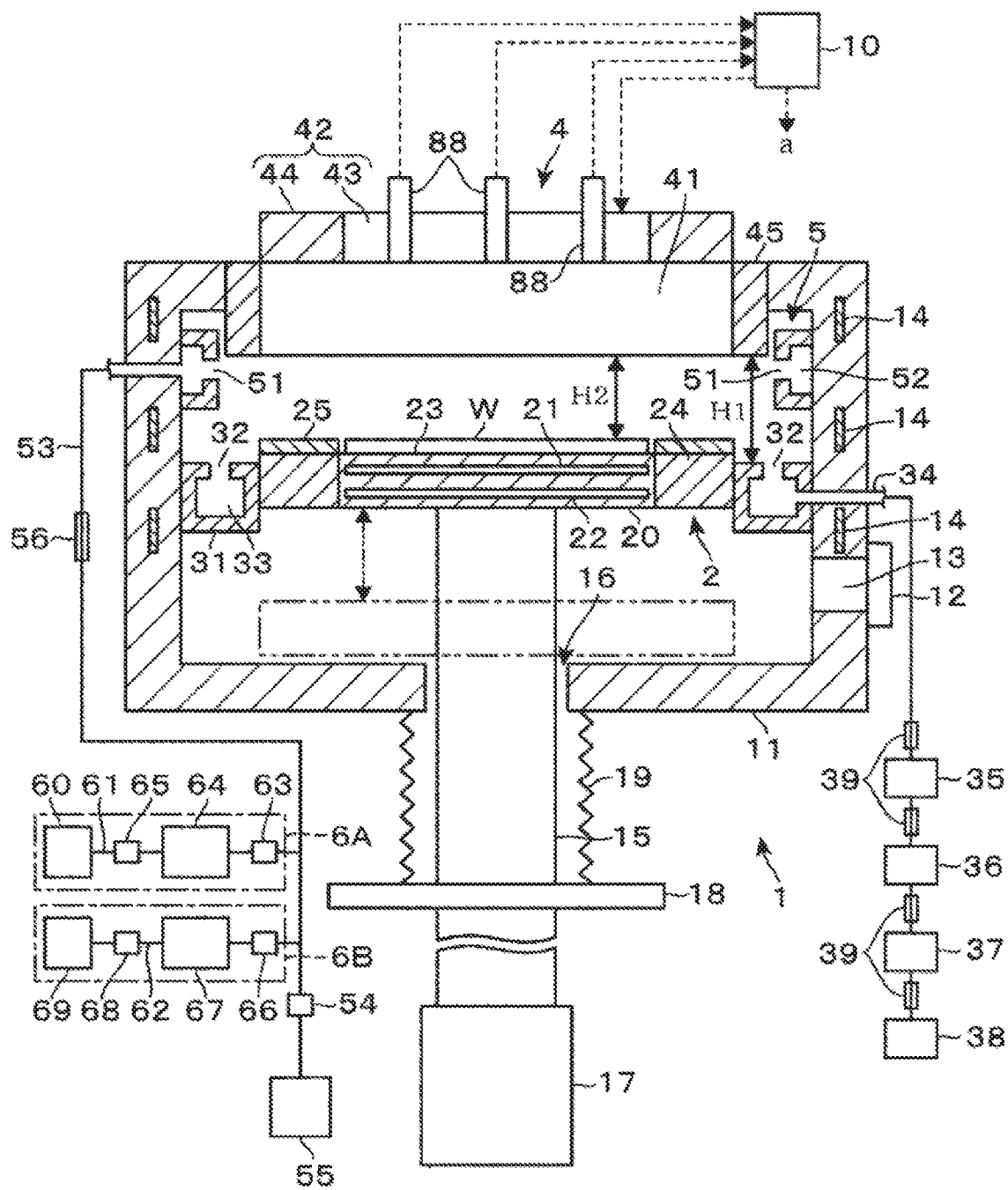
FIG. 1 is a vertical cross-sectional view of a substrate processing apparatus according to an embodiment of the present disclosure.
Figure 2:
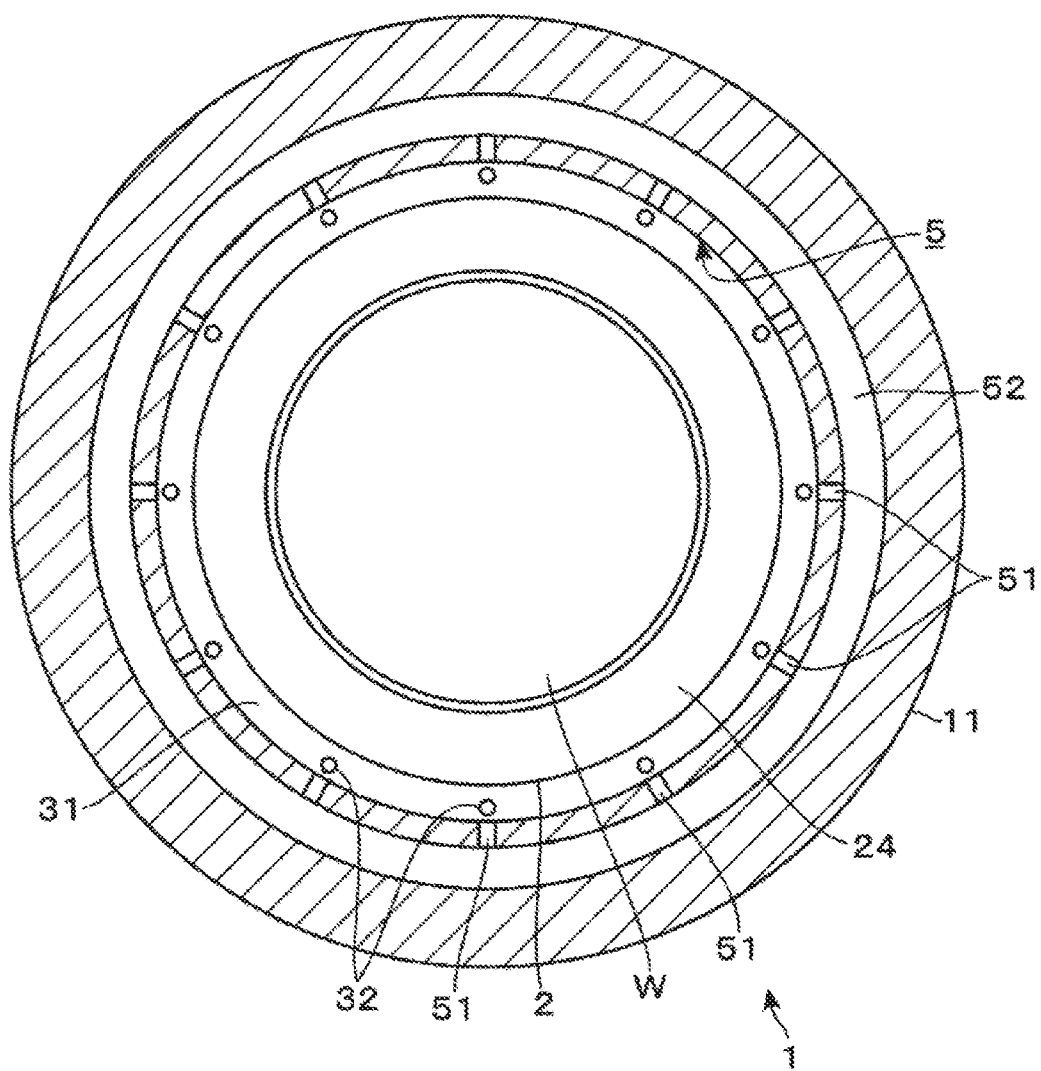
FIG. 2 is a horizontal cross-sectional view of the substrate processing apparatus.
Figure 3:
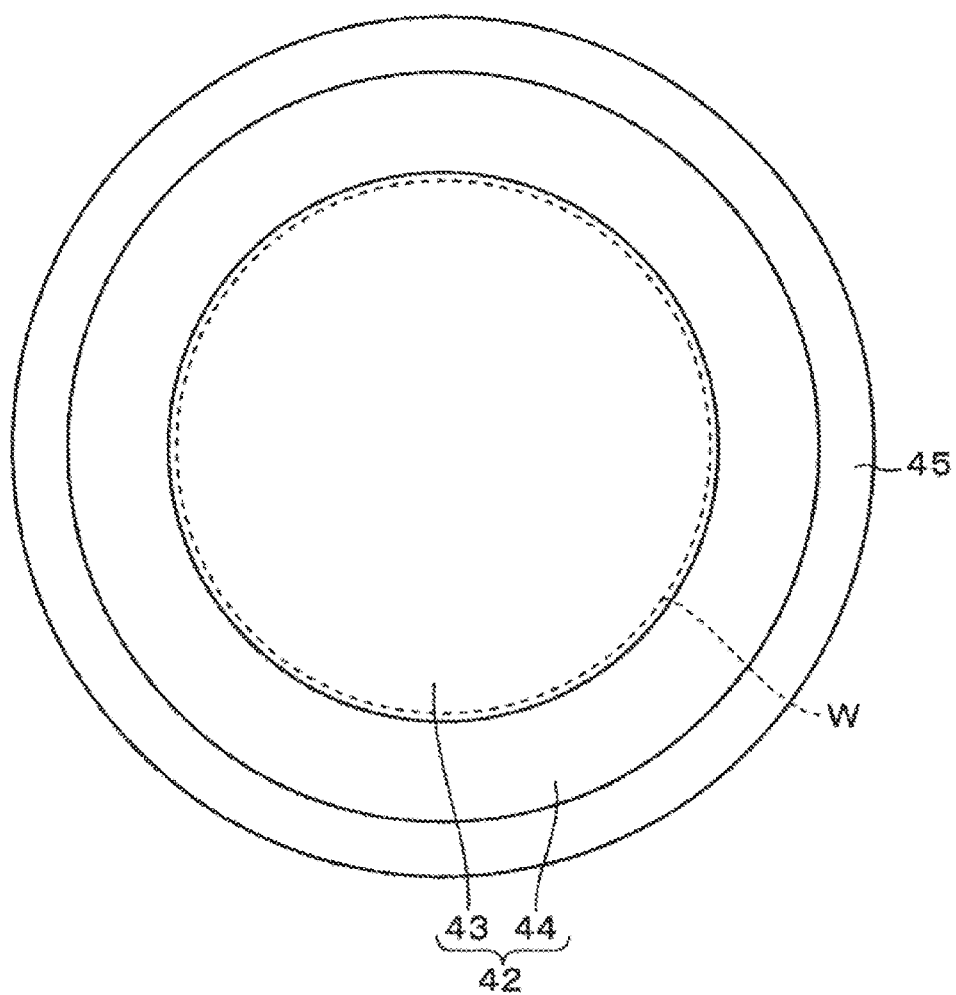
FIG. 3 is a top plan view of the substrate processing apparatus.

Hereinafter, a description will be made with reference to FIGS. 1, 2, and 3, which are a vertical cross-sectional view, a horizontal cross-sectional view, and a top view of the substrate processing apparatus 1, respectively. The substrate processing apparatus 1 includes a circular processing container 11. In a lower portion of a sidewall of the processing container 11, a transfer port 13 through which the wafer W is transferred is formed. The transfer port 13 is opened and closed by a gate valve 12. In addition, a sidewall heater 14 for heating the sidewall is provided in the sidewall of the processing container 11 above the transfer port 13 such that film formation on the sidewall is suppressed.

A stage 2, as a circular placement portion supported by a column 15, is provided inside the processing container 11. The column 15 penetrates an opening 16 formed in a bottom portion of the processing container 11. A lower end portion of the column 15 is connected to a lifting mechanism 17 provided outside the processing container 11. The airtightness in the processing container 11 is ensured by a bellows 19 connected to a flange 18 provided on a lower portion of the column 15 and a peripheral portion of the opening 16.

By the above-described lifting mechanism 17, the stage 2 is raised and lowered between a processing position at which processing is performed on the wafer W and a standby position defined below the processing position. At the standby position, the wafer W is delivered between the stage 2 and a transfer mechanism which enters the processing container 11 through the transfer port 13. The processing position and the standby position are respectively indicated by the solid line and the two-dot chain line in FIG. 1. Lifting pins (not illustrated) are provided in the bottom portion of the processing container 11 to deliver the wafer W between the transfer mechanism and the stage 2 at the standby position. The lifting pins are not shown in FIG. 1.

A central heater 21 and a coolant flow path 22 are embedded in a central portion 20 of the stage 2. The flow path 22 serving as a cooling part constitutes a chiller. A temperature-controlled coolant is supplied to the flow path 22. By the heat generated by the central heater 21 and the cooling action of the coolant flowing through the flow path 22, a temperature of the wafer W placed on a horizontal placement area 23 as a front surface of the central portion 20 is adjusted to a desired temperature.

A peripheral portion of the stage 2 surrounding the central portion 20 is configured as an annular peripheral heater 24. The peripheral heater 24 is temperature-controlled independently of the central heater 21. A position regulation portion 25, which surrounds the lateral side of the wafer W on the placement area 23 and regulates the position of the wafer W, is provided on the peripheral heater 24. The placement area 23 is configured as a bottom surface of a shallow recess.

In addition, a ring-shaped exhaust block 31 formed along the circumference of the processing container 11 so as to protrude from the sidewall of the processing container 11 is provided to surround the stage 2 located at the processing position. For example, a top surface of the exhaust block 31 is located lower than that of the stage 2. A large number of exhaust ports 32 are formed in the top surface of the exhaust block 31. The exhaust ports 32 are arranged along the circumference of the exhaust block 31.

In the exhaust block 31, a ring-shaped flow path 33 is formed along the circumference of the exhaust block 31 and connected to each of the exhaust ports 32. The ring-shaped flow path 33 communicates with an exhaust pipe 34 which is connected from the outside of the processing container 11. In the exhaust pipe 34, an exhaust amount adjustment valve 35, a valve 36, a dry pump 37, and a detoxifying device 38 are provided in this order toward the downstream side. In a state in which the valve 36 is opened and the dry pump 37 is operated, an opening degree of the exhaust amount adjustment valve 35 is adjusted, so that the interior of the processing container 11 is adjusted to become a vacuum atmosphere of a desired pressure. The exhaust pipe 34 is provided with an exhaust pipe heater 39. A pipe wall of the exhaust pipe 34 is heated by the exhaust pipe heater 39, whereby film formation on the pipe wall by the film-forming gas is suppressed.

In the processing container 11, a light irradiation part 4 which irradiates the wafer W with light to heat the water W is provided above the stage 2. Accordingly, the light irradiation part 4 is a heating part configured to heat the wafer W in a non-contact manner, and includes a window 41 made of, for example, quartz, and a lamp heater 42 provided above the window 41. The window 41 is a flat circular light guide member configured to guide the light of the lamp heater 42 downward, and is provided so as to protrude downward from the central portion of the ceiling of the processing container 11. A bottom surface of the window 41 is formed horizontally so as to face the front surface of the stage 2, and forms a ceiling surface as an inner wall surface of the processing container 11.

The lamp heater 42 serving as a light source irradiates the front surface (top surface) of the stage 2 with light through the window 41. This light is, for example, light having a wavelength of 400 nm to 1 mm, namely an infrared light or visible light. The lamp heater 42 includes a central lamp heater 43 and a peripheral lamp heater 44. The peripheral lamp heater 44 is provided so as to surround a lateral circumference of the central lamp heater 43. The central lamp heater 43 serving as a first light irradiation part and the peripheral lamp heater 44 serving as a second light irradiation part are configured to be able to perform ON/OFF switching independently of each other. The central lamp heater 43 irradiates the central portion of the stage 2 with light, and the peripheral lamp heater 44 irradiates the peripheral portion of the stage 2 with light.

In addition, a ring heater 45, which is a heating part that surrounds a lateral side of the window 41 to heat the window 41, is provided. In this example, heights of lower ends of the ring heater 45 and the window 41 are aligned to each other. For example, a distance H1 between the lower end of the ring heater 45 and the top surface of the exhaust block 31 may be 60 mm. In addition, a distance H2 between the bottom surface of the window 41 and the front surface of the wafer W placed on the stage 2 is, for example, 5 nm to 30 nm.

The window 41 is configured such that the transmittance of light emitted from the central lamp heater 43 and the peripheral lamp heater 44 is, for example, 50%. Accordingly, the window 41 is configured as a heat storage member having light absorptivity. The temperature of the window 41 rises due to the heat storage available when irradiated with light from the central lamp heater 43 or the peripheral lamp heater 44. A plurality of non-contact type thermometers (radiation thermometers) 88 are provided above the window 41 at intervals in the horizontal direction. The non-contact type thermometers 88 receive the infrared rays emitted from the wafer W and transmitted through the window 41, and transmit detection signals to a controller 10. Then, the controller 10 detects a temperature based on the detection signals. That is, surface temperatures are detected at a plurality of locations on the front surface of the wafer W. The controller 10 may adjust the output of the central heater 21 of the stage 2 based on the detected surface temperatures of the wafer W during the annealing process (to be described later) and set the temperature of the wafer W to a set temperature.

As described above, the light transmittance of the window 41 is not 100%. Therefore, only some of the radiation emitted from the wafer W will be radiated to the non-contact type thermometers 88 through the window 41. That is, the detected temperature is lower than the actual temperature of the wafer W. The controller 10 corrects the detected temperature by adding a correction value, and treats the corrected temperature as the detected temperature of the wafer W.

A ring-shaped gas supply part 5, which is formed along the circumference of the processing container 11 so as to protrude from the sidewall of the processing container 11, is provided above the exhaust block 31 to extend along the circumference of the processing container 11. The gas supply part 5 constitutes a film-forming gas supply part configured to supply a gas containing a film-forming gas (to be described later) into the processing container 11. A large number of gas ejection ports 51 are formed in an inner peripheral portion of the gas supply part 5, and form a row in the circumferential direction of the gas supply part 5. Each gas ejection port 51 is opened below the window 41 and the ring heater 45 to eject the gas toward the central portion of the stage 2 when viewed in a plan view.

In the gas supply part 5, a ring-shaped flow path 52 is formed along the circumference of the gas supply part 5 and connected to each gas ejection port 51. The ring-shaped flow path 52 communicates with the downstream end of a gas supply pipe 53 connected from the outside of the processing container 11. The upstream side of the gas supply pipe 53 is connected to a N2 (nitrogen) gas source 55 via a flow rate adjustment part 54.

The downstream end of each of gas supply pipes 61 and 62 is connected to the downstream side of the flow rate adjustment part 54 in the gas supply pipe 53. The upstream side of the gas supply pipe 61 is connected to a $N_2$ gas source 60 via a flow rate adjustment part 63, a vaporization part 64, and a flow rate adjustment part 65. The upstream side of the gas supply pipe 62 is connected to a $N_2$ gas source 69 via a flow rate adjustment part 66, a vaporization part 67, and a flow rate adjustment part 68. The flow rate adjustment parts 63, 65, 66, and 68 are constituted by valves and mass flow controllers. The flow rate adjustment parts 63, 65, 66, and 68 perform the supply and cutoff of gas to the downstream side and adjust the supply flow rate of the gas, based on control signals received from the controller 10 (to be described later).

For example, 1,3-bis (aminomethyl) cyclohexane (H6XDA) as diamine remaining in a liquid state is stored in the vaporization part 64. $N_2$ gas is supplied from the upstream side of the gas supply pipe 61 to the vaporization part 64 so that the liquid is vaporized. This vapored gas is supplied to the downstream side of the gas supply pipe 61 as a first film-forming gas. A combination of the flow rate adjustment parts 63 and 65, the vaporization part 64, and the $N_2$ gas source 60 constitutes a first film-forming gas supply part 6A. For example, 1,3-bis (isocyanatomethyl) cyclohexane (H6XDI) as diisocyanate remaining in a liquid state is stored in the vaporization part 67. A $N_2$ gas is supplied from the upstream side of the gas supply pipe 62 to the vaporization part 67 so that the liquid is vaporized. This vapored gas is supplied to the downstream side of the gas supply pipe 62 as a second film-forming gas. A combination of the flow rate adjustment parts 66 and 68, the vaporization part 67, and the $N_2$ gas source 69 constitutes a second film-forming gas supply part 6A.

With the piping system configured as described above, the first film-forming gas, the second film-forming gas, and the $N_2$ gas are supplied to the gas supply pipe 53 at desired flow rates, respectively, so that each gas can be ejected from the gas supply part 5. In addition, in a case where a $N_2$ gas is described simply without a particular description, the $N_2$ gas refers to a single $N_2$ gas. That is, as described above, the $N_2$ gas is supplied to vaporize the liquid and thus generate the first film-forming gas and the second film-forming gas. As such, the $N_2$ gas will be included in the first film-forming gas and the second film-forming gas. However, the $N_2$ gas used herein does not refer to $N_2$ gas included in these film-forming gases.

During processing of the wafer W (to be described later), for example, the supply of the $N_2$ gas from the gas source 55 to the gas supply part 5 is always performed. In the film-forming process during the processing of the wafer W, when each of the first film-forming gas and the second film-forming gas is being supplied to the gas supply part 5, the $N_2$ gas acts as a carrier gas of each film-forming gas. When the first film-forming gas and the second film-forming gas are not being supplied to the gas supply part 5, the $N_2$ gas acts as a purge gas for purging the interior of the processing container 11.

In addition, the gas supply pipe 53 is provided with a pipe heater 56 configured to heat the pipe wall in order to prevent the first film-forming gas and the second film-forming gas from being cooled down and forming a film on the pipe wall. In addition, the pipe heater 56 is provided in a relatively wide range in the longitudinal direction of the gas supply pipe 53 in order to fulfill such a role. However, for the sake of convenience in illustration in FIG. 1, the pipe heater 56 is illustrated to be provided locally. Further, for the sake of convenience in illustration, the exhaust pipe heater 39 is also illustrated to be provided locally just like the pipe heater 56. Although the $N_2$ gas sources 55, 60, and 69 are illustrated as separate bodies in FIG. 1, these gas sources may be the same gas source.

The substrate processing apparatus 1 includes the controller 10 as a computer. The controller 10 includes a program, a memory, and a CPU. The program incorporates instructions (respective steps) so as to proceed the processing of the wafer W (to be described later). The program is stored in a non-transitory computer-readable storage medium such as a compact disk, a hard disk, a magneto-optical disk, a DVD) or the like, and is installed on the controller 10. The controller 10 outputs a control signal to each part of the substrate processing apparatus 1 according to the program, and controls the operation of each part. Specifically, each operation, such as the adjustment of the opening degree of the exhaust amount adjustment valve 35, the opening/closing of the valve 36 of the exhaust pipe 34, and the ON/OFF switching of each of the central lamp heater 43 and the peripheral lamp heater 44 described above, is controlled by the control signal. In addition, the supply/cutoff of each gas to the downstream side of the pipe by the flow rate adjustment parts 63, 65, 66, and 68, the lifting of the stage 2 by the lifting mechanism 17, and the like are also controlled by the control signal.

Figure 8A:
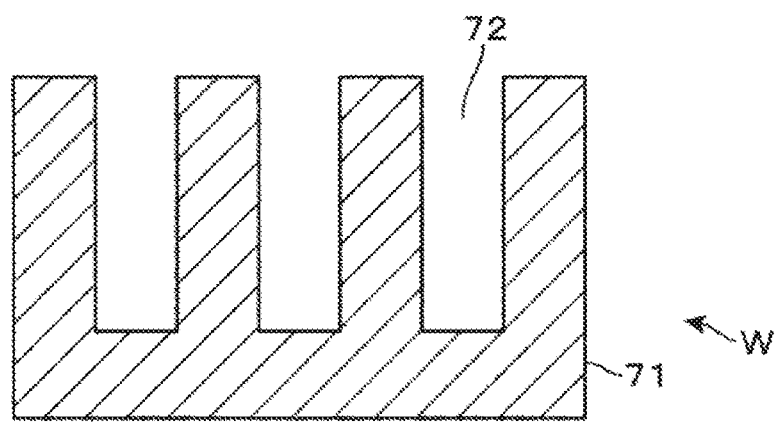
FIG. 8A is a schematic longitudinal cross-sectional view of a wafer processed by the substrate processing apparatus.

Next, the processing performed on the wafer W using the substrate processing apparatus 1 will be described with reference to FIGS. 4 to 7, each of which illustrates an operation of the substrate processing apparatus 1, and FIGS. 8A to 8E and FIGS. 9A to 9C, which are schematic vertical cross-sectional views illustrating states in which the front surface of the wafer W is varied. FIG. 8A illustrates the front surface of the wafer W before being processed by the substrate processing apparatus 1. A layer 71 made of, for example, silicon oxide, is formed on the front surface. Concave portions 72 serving as a pattern are formed in the layer 71. In the processing performed by the substrate processing apparatus 1 described below, a polyurea film 73 is buried in the concave portions 72 such that the height of a front surface of the polyurea film is aligned with that of the layer 71 outside the concave portions 72.

The exhaust pipe 34, the gas supply pipe 53, the sidewall of the processing container 11, and the window 41 are respectively heated to, for example, 150 degrees C., by the exhaust pipe heater 39, the pipe heater 56, the sidewall heater 14, and the ring heater 45, in order to suppress film from being formed on the exhaust pipe 34, the gas supply pipe 53, the sidewall of the processing container 11, and the window 41. In the stage 2, the temperature of the central portion 20 constituting the placement area 23 for the wafer W is adjusted to, for example, 80 degrees C., by the heat generated by the central heater 21 and the supply of the coolant to the flow path 22. Meanwhile, the temperature of the peripheral heater 24 of the stage 2 is adjusted to, for example, a temperature slightly higher than the placement area 23 and lower than the temperature of the window 41 in order to suppress film from being formed on the peripheral portion of the stage 2. At this time, the irradiation of light from the central lamp heater 43 and the peripheral lamp heater 44 is stopped.

Then, the wafer W having the front surface configured as illustrated in FIG. 8A is loaded into the processing container 11 through the opened transfer port 13. The wafer W is delivered to the stage 2 located at the standby position and is placed on the placement area 23. Thereafter, the transfer port 13 is closed, and the stage 2 is raised toward the processing position. The $N_2$ gas is supplied from the $N_2$ gas source 55 to the gas supply part 5 at, for example, 100 sccm to 2000 sccm, and is ejected from the gas supply part 5. Meanwhile, the interior of the processing container 11 is exhausted from the exhaust block 31 so that the interior of the processing container 11 is set to have a pressure of, for example, 0.1 Torr (13.3 Pa) to 10 Torr (1.333×103 Pa). The wafer W placed on the stage 2 is heated to 80 degrees C. by heat transfer from the stage 2. The temperature of the wafer W may be set to a relatively low temperature at which the film-forming process easily proceeds as described later, and may be set to a temperature slightly higher than the temperature of the placement area 23, for example, about 85 degrees C., due to radiant heat from the sidewall of the processing container 11 and the window 41.

Subsequently, the first film-forming gas, which is an amine, is supplied from the first film-forming gas supply part 6A to the gas supply part 5, and is ejected from the gas supply part 5 into the processing container 11, whereby the film-forming process (a first round of film-forming process) is started (FIG. 4). Since the wafer W is kept at a relatively low temperature as described above, the first film-forming gas is efficiently adsorbed onto the wafer W. Meanwhile, since the window 41 and the sidewall of the processing container 11 are heated to 150 degrees C., which is higher than the temperature of the wafer W, the adsorption of the first film-forming gas onto the window 41 and the sidewall of the processing container 11 is suppressed. Thereafter, the supply of the first film-forming gas from the first film-forming gas supply part 6A is stopped, and the $N_2$ gas is ejected from the gas supply part 5. Thus, the first film-forming gas remaining in the processing container 11 is purged and removed from the interior of the processing container 11.

Thereafter, the second film-forming gas, which is an isocyanate, is supplied from the second film-forming gas supply part 6B to the gas supply part 5, and is ejected from the gas supply part 5 into the processing container 11. Like the first film-forming gas, the second film-forming gas is efficiently adsorbed onto the wafer W having a relatively low temperature. Then, the first film-forming gas and the second film-forming gas adsorbed onto the wafer W react with each other to cause polymerization by formation of urea bonds, thereby forming the polyurea film 73 (FIG. 5). Meanwhile, the second film-forming gas is suppressed from being adsorbed onto the window 41 and the sidewall of the processing container 11, which are at a higher temperature than the temperature of the wafer W. Since both the first film-forming gas and the second film-forming gas are suppressed from being adsorbed onto the window 41 and the sidewall of the processing container 11 as described above, the film formation of the polyurea film 73 on the window 41 and the sidewall of the processing container 11 is suppressed. In addition, film formation is also suppressed with respect to the exhaust pipe 34 and the gas supply pipe 53, which have been heated in the same manner as the window 41 and the sidewall of the processing container 11.

Thereafter, the supply of the second film-forming gas from the second film-forming gas supply part 6B is stopped, and the $N_2$ gas is ejected from the gas supply part 5. Thus, the second film-forming gas remaining in the processing container 11 is purged and removed from the interior of the processing container 11. Thereafter, assuming that a series of processes including the supply of the first film-forming gas, the purging of the first film-forming gas, the supply of the second film-forming gas and the purging of the second film-forming gas is a film formation cycle, the film formation cycle is repeatedly performed so that the thickness of the polyurea film 73 is increased.

Figure 8B:
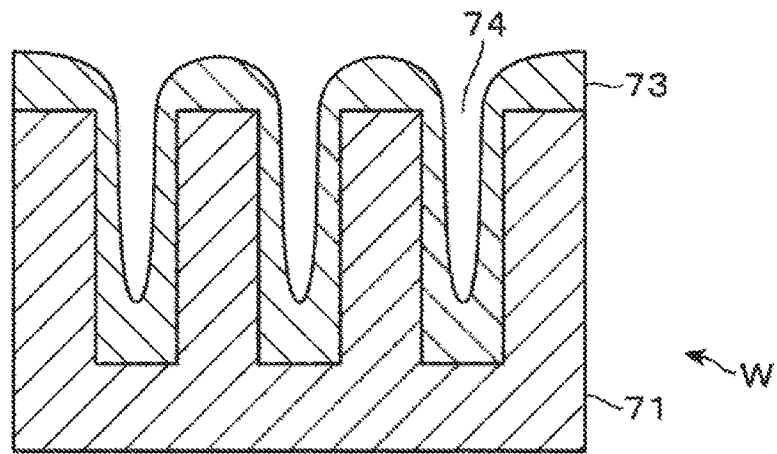
FIG. 8B is a schematic longitudinal cross-sectional view of the wafer.

When the film formation cycle is performed a predetermined number of times, for example, in the state in which the ejection of the $N_2$ gas from the gas supply part 5 and the exhaust of the interior of the processing container 11 are continuously performed, the irradiation of light from the central lamp heater 43 and the peripheral lamp heater 44 is started (FIG. 6). In FIG. 6 and FIG. 7 to be described later, optical paths are indicated by dotted line arrows. FIG. 8B illustrates the wafer W at the start of the annealing process. The polyurea film 73 is formed along the concave portions 72, and thus the polyurea film 73 has concave portions 74 having a narrow width. Bottom surfaces of the concave portions 74 are lower in height than outer edges of the concave portions 72. Accordingly, the filling of the concave portions 72 with the polyurea film 73 is in an incomplete state.

Due to the above-mentioned light irradiation, the temperature of the window 41 rises to a temperature higher than the temperature at which the polyurea film 73 is depolymerized, for example, 350 degrees C. At such a high temperature, the polyurea film 73, which has been slightly formed on the window 41, is quickly depolymerized during the film-forming process, and the gas generated by the depolymerization is exhausted and removed. By removing the polyurea film 73 on the window 41, the wafer W is irradiated with light and the temperature of the wafer W quickly rises to, for example, 280 degrees C. Since the temperature of the wafer W is lower than the temperature of the window 41, the depolymerization of the polyurea film 73 proceeds relatively slowly, and the surface portion of the polyurea film 73 gasified by the depolymerization diffuses into the surrounding atmosphere so as to be exhausted and removed. In addition, by removing the polyurea film 73 on the window 41, the temperature of the front surface of the wafer W is measured by the above-described non-contact type thermometers 88, and the output of the central heater 21 is adjusted based on the measurement.

The light irradiation part 4 including the central lamp heater 43 and the peripheral lamp heater 44, which serve as heat sources, is provided to be spaced apart from the stage 2 and is configured to heat the wafer W in a non-contact manner. Thus, the stage 2 is hardly affected by the heat generated by the light irradiation part 4. The temperature of the central portion 20 constituting the placement area 23 of the stage 2 is adjusted by supplying the coolant. In addition, since the stage 2 is larger in temperature than the wafer W, the stage 2 is also larger than the wafer W in heat capacity, and the influence of heat transfer from the wafer W is small. Accordingly, a change in temperature of the stage 2 during the annealing process is suppressed, and the central portion 20 of the stage 2 is maintained at, for example, 80 degrees C. as in the film-forming process.

Figure 8C:
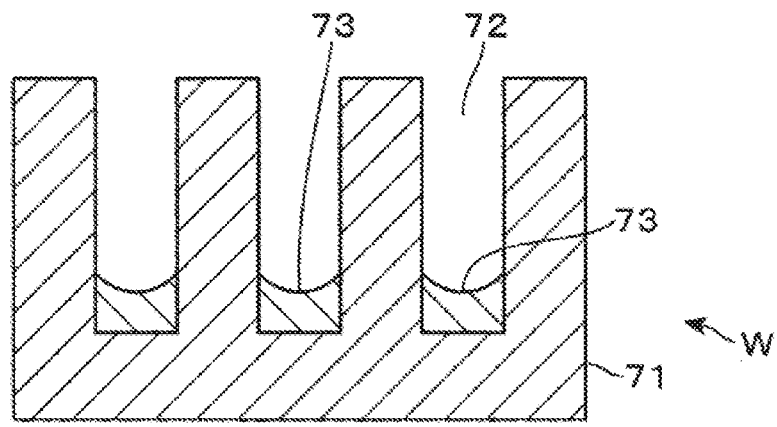
FIG. 8C is a schematic longitudinal cross-sectional view of the wafer.

After a predetermined period of time since the light irradiation is started, the irradiation of light from the center lamp heater 43 and the peripheral lamp heater 44 is stopped, the annealing process is temporarily ended, and the temperature of the wafer W and the temperature of the window 41 are lowered to return to 80 degrees C. and 150 degrees C., respectively. FIG. 8C illustrates the wafer W at the end of the annealing process. By removing the surface portion as described above, the poly urea film 73 is removed from the outside of the concave portions 72 and the upper sides of the sidewalls of the concave portions 72, whereby the layer 71 is exposed and the concave portions 74 having a narrow width have disappeared. The polyurea film 73 remains in the bottom portions of the concave portions 72.

Since the change in temperature of the placement area 23 was suppressed during a first round of annealing process, the temperature of the wafer W is quickly adjusted to 80 degrees C. by stopping the light irradiation. After the temperature adjustment of the wafer W, a second round of film-forming process similar to the first round of film-forming process described above is started. That is, a second round of processing cycle is started. In the second round of film-forming process, since the concave portions 74 having a narrow width have disappeared as described above, the first film-forming gas and the second film-forming gas relatively easily flow into the concave portions 72 of the layer 71. Accordingly, the thickness of the polyurea film 73 at the bottom of the concave portions 72 increases relatively quickly.

Figure 8D:
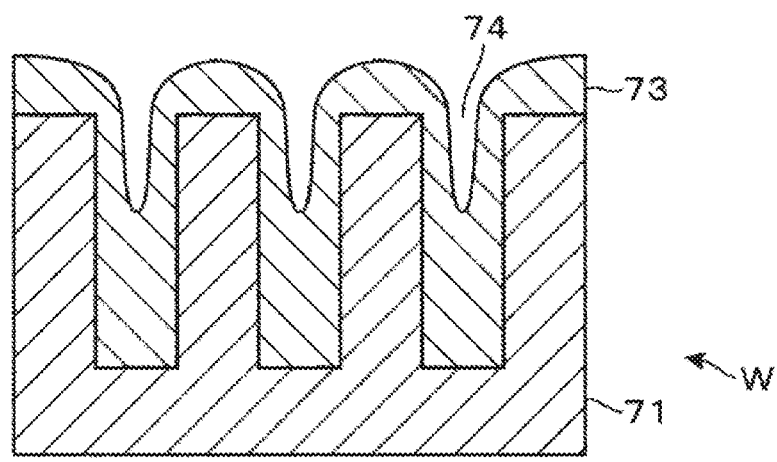
FIG. 8D is a schematic longitudinal cross-sectional view of the wafer.
Figure 8E:
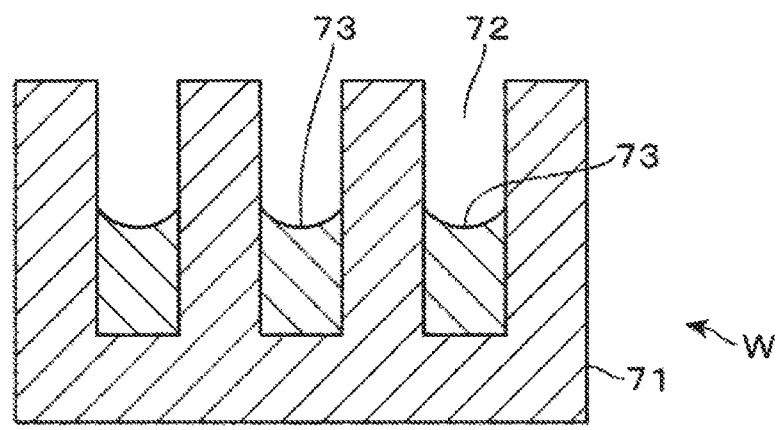
FIG. 8E is a schematic longitudinal cross-sectional view of the wafer.

Subsequently, a second round of annealing process similar to the first round of annealing process described above is started. FIG. 8D illustrates the wafer W at the start of the second round of annealing process. Since the second round of film-forming process is performed in the state in which the polyurea film 73 remains in the concave portions 72, at the start of the second round of annealing process, the bottom surfaces of the concave portions 74 in the polyurea film 73 are higher than the bottom surfaces of the concave portions 74 at the start of the first round of annealing process. That is, the filling of the concave portions 72 with the polyurea film 73 is more advanced than at the start of the first round of annealing process. Then, as the second round of annealing process proceeds, the polyurea film 73 formed on the window 41 is removed and the surface portion of the polyurea film 73 on the wafer W is removed as in the first round of annealing process. FIG. 8E illustrates the wafer W at the end of the second round of annealing process, in which the polyurea film 73 is formed to reach a position in each of the concave portions 72 higher than that at the end of the first round of annealing process.

Figure 9A:
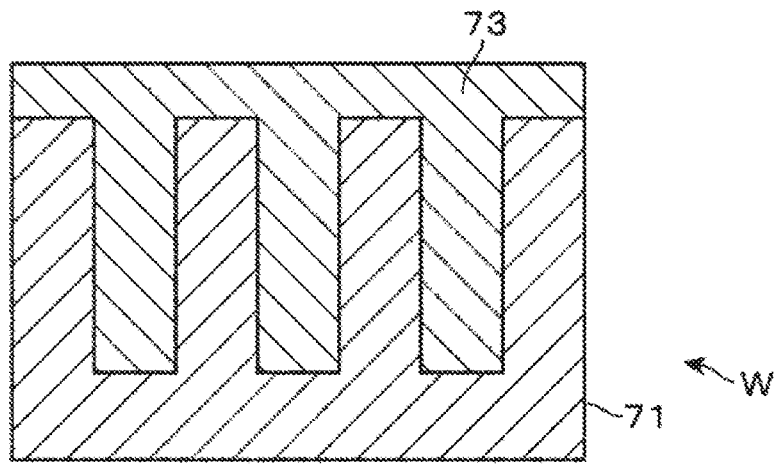
FIG. 9A is a schematic longitudinal cross-sectional view of the wafer.
Figure 9B:
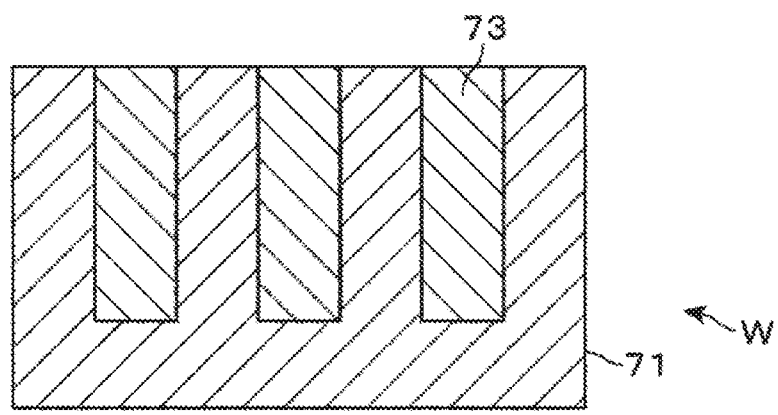
FIG. 9B is a schematic longitudinal cross-sectional view of the wafer.

In addition, by repeating the processing cycle including the film-forming process and the annealing process, the filling of the concave portions 72 with the polyurea film 73 proceeds. As the filling of the concave portions 72 proceeds in this manner, the flatness of the front surface of the polyurea film 73 at the end of the film-forming process is improved (FIG. 9A). The annealing process is performed in the state in which the flatness is improved, so that the height of the front surface of the polyurea film 73 and the height outside the concave portions 72 are aligned with each other (FIG. 9B). After the processing cycle is performed a predetermined number of times, the wafer W is unloaded from the processing container 11. FIGS. 9A and 9B illustrate the wafer W at the start of the annealing process and the wafer W at the end of the annealing process in the last processing cycle, respectively.

Figure 9C:
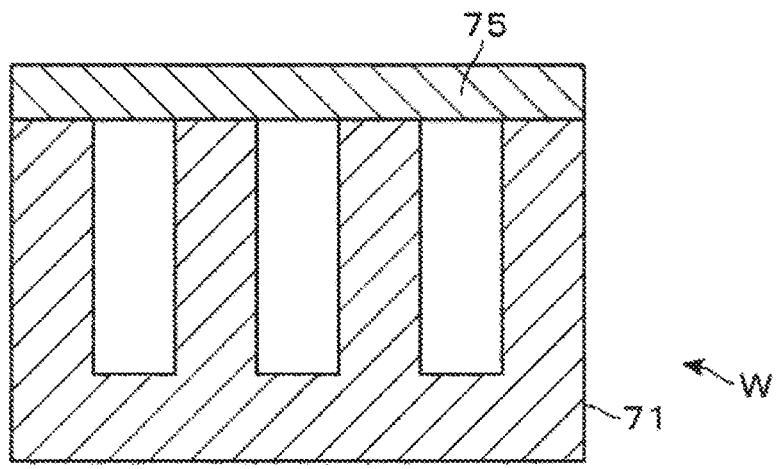
FIG. 9C is a schematic longitudinal cross-sectional view of the wafer.

A gas-permeable film (cap film) 75 is formed on the front surface of the wafer W unloaded from the processing container 11. Thereafter, the wafer W is heated to depolymerize the polyurea film 73. Gas generated by the depolymerization is removed via the cap film 75. Thus, the interior of each concave portion 72 forms a sealed space (air gap) for insulating between wiring lines to be formed on the wafer W later (FIG. 9C). That is, the polyurea film 73 is a sacrificial film for forming the air gap.

During the execution of the above-described processing cycle, the peripheral heater 24 of the stage 2 is kept at a lower temperature than, for example, the temperature of the window 41 and the temperature of the sidewall of the processing container 11. Thus, when the wafer W is unloaded from the processing container 11 as described above, the polyurea film 73 is slightly formed on the position regulation portion 25 on the peripheral portion of the stage 2. After unloading the wafer W from the processing container 11, the stage 2 is located at the processing position, and light is radiated from the peripheral lamp heater 44 in the state in which the supply of the $N_2$ gas into the processing container 11 and the exhaust of the $N_2$ gas from the processing container 11 are performed in the same manner as in the execution of the processing cycle. In addition, for example, the temperature of the peripheral heater 24 is set to a temperature e.g., 200 degrees C.) higher than that during the execution of the processing cycle. Due to the light irradiation from the peripheral lamp heater 44 and the heat generated by the peripheral heater 24, the temperature of the position regulation portion 25 reaches, for example, 350 degrees C., and the polyurea film 73 on the front surface of the position regulation portion 25 is depolymerized and removed. That is, cleaning of the outside of the placement area 23 for the wafer W in the stage 2 is performed.

Even during this cleaning, the increase in temperature of the central portion 20 of the stage 2 is suppressed since the peripheral lamp heater 44 irradiates the peripheral portion of the stage 2 with limited light and, of the central heater 21 and the peripheral heater 24, only the peripheral heater 24 has a higher temperature. Thereafter, the light irradiation from the peripheral lamp heater 44 is stopped, and the above-described cleaning is completed. After the cleaning is completed, a next wafer W is loaded into the processing container 11, and the processing cycle is repeatedly performed as described above so as to process the water W. Since the increase in temperature of the central portion 20 during the cleaning is suppressed as described above, the temperature adjustment of the wafer W placed on the placement area 23 of the central portion 20 after the cleaning is quickly completed, and the above-described processing cycle is started. This cleaning is performed, for example, every time one wafer W is processed, but may be performed each time a plurality of wafers W are processed.

As represented in an evaluation test to be described later, in a case where the surface portion of the polyurea film 73 is removed by exposing the wafer W to plasma, radicals generated by cleavage of the cross-links forming the polyurea film 73 generate components in which the polyurea film 73 is modified. As described above, since the polyurea film 73 is a sacrificial film, the polyurea film 73 is removed in the subsequent process. However, when the removal of the polyurea film 73 is performed, the modified component may remain on the wafer W as a residue. However, according to the substrate processing apparatus 1, the polyurea film 73 formed on the wafer W is depolymerized and the surface portion of the polyurea film 73 is removed by heating the wafer through the light irradiation from the lamp heater 42. That is, since the surface portion of the polyurea film 73 is removed without using plasma and without generating the above-mentioned radicals, it is possible to suppress generation of the above-mentioned residue.

According to the substrate processing apparatus 1, the film-forming process and the annealing process are performed on the wafer W inside the common processing container 11. Accordingly, compared with a case where a processing container dedicated to the film-forming process and a processing container dedicated to the annealing process are provided, and the wafer W is processed by being transferred between these processing containers, according to the substrate processing apparatus 1, it is not necessary to transfer the wafer W between the processing containers. Thus, it is possible to obtain high throughput. In addition, the above-described annealing process may be performed in the state in which the wafer W is spaced apart from the stage 2. That is, heating may be performed in the state in which the wafer W is spaced apart from the front surface of the stage 2 by being supported by pins as in an example (to be described later).

In the film-forming process, in order to cause the film-forming gas to be efficiently adsorbed onto the wafer, it is desirable to set the temperature of the wafer W to a relatively low temperature. Meanwhile, during the annealing process, it is necessary to set the temperature of the wafer W to a relatively high temperature so as to remove the polyurea film 73. Thus, there is a difference in the appropriate temperature zone of the wafer W between the film-forming process and the annealing process. In the above-described substrate processing apparatus 1 the wafer W is placed on the central portion 20 of the stage 2 maintained at a relatively low temperature, and the light irradiation part 4 irradiates the wafer W with light during the annealing process as described above, thereby heating the wafer W in a non-contact manner. When the light irradiation is stopped, the wafer W is hardly affected by the temperature of the light irradiation part 4 because the wafer W is heated in the non-contact manner. Meanwhile, since the temperature of the central portion 20 of the stage 2, Which is in contact with the wafer W, is relatively low, the temperature of the wafer W is quickly lowered even if the stage 2 is not cooled down by lowering the temperature of the central heater 21 of the stage 2. That is, since it is not necessary to raise and lower the temperature of the central heater 21 by switching between the film-forming process and the annealing process, the time required for adjusting the temperature of the wafer W can be suppressed from being prolonged. Accordingly, in repeating the processing cycle as described above, it is possible to quickly start the film-forming process subsequent to the annealing process. This achieves high throughput. In addition, after processing one sheet of water W, when the next wafer W is placed on the stage 2, it is possible to quickly adjust the temperature of the wafer W and to start processing. Thus, from such a viewpoint, it is also possible to obtain high throughput. It is not necessary to change the temperature of the central heater 21 for switching between the film-forming process and the annealing process as described above, but the temperature may be slightly changed. That is, the temperature of the placement area 23 of the stage 2 is not limited to be constant from processing to processing.

Depending on an aspect ratio of the concave portions 72, it is possible to sufficiently bury the polyurea film 73 in the concave portions 72 by performing the film-forming process and the annealing process once. Further, it is not always necessary to bury the polyurea film 73 in the concave portions 72 until the height of the surface of the polyurea film 73 becomes the same height as the outside of the concave portions 72. That is, the above-described processing cycle is not necessarily repeatedly performed on one sheet of wafer W, and the processing cycle may be performed only once. Even in such a case, since the processing interval between one wafer W and the next wafer W is suppressed from being lengthened as described above, it is possible to improve throughput.

In addition, during the film-forming process, the window 41 is heated to a temperature higher than the temperature of the wafer W by the lamp heater 42, thereby suppressing the film formation on the window 41. Accordingly, the polyurea film 73 is removed from the window 41 in a short period of time after the start of the annealing process, and the wafer W is irradiated with light. Therefore, it is possible to quickly raise the temperature of the wafer W after the start of the annealing process, thus obtaining higher throughput.

In addition, the lamp heater 42 includes the peripheral lamp heater 44 configured to perform cleaning by locally irradiating the peripheral portion of the stage 2 outside the placement area 23 for the wafer W with light after the processing of the wafer W. By this cleaning, it is possible to prevent particles from being generated from the polyurea film 73 formed on the peripheral portion of the stage 2 during the processing of the preceding wafer W and from causing a problem in the processing of the subsequent wafer W. In addition, by performing such cleaning using the peripheral lamp heater 44 provided to be spaced apart from the stage 2, the increase in temperature of the central portion 20 of the stage 2 during the cleaning is suppressed. Thus, after the cleaning, it is possible to quickly start the processing of the wafer W as described above. The cleaning is not limited to being performed by the light irradiation from the peripheral lamp heater 44 and the increase in temperature of the peripheral heater 24 of the stage 2. For example, the cleaning may be performed by performing only one of the light irradiation and the temperature increase.

Incidentally, the plurality of gas ejection ports 51 of the gas supply part 5 have been described to be opened, but only one gas ejection port 51 may be opened as long as the gas can be supplied to the wafer W. In addition, in the above example, in order to suppress the unnecessary formation of the polyurea film 73 on each pipe and the processing container 11, the first film-forming gas and the second film-forming gas are supplied into the processing container 11 at different timings. However, these film-forming gases may be simultaneously supplied into the processing container 11 so as to perform film formation. In addition, the appropriate temperature of the wafer W during the film-forming process varies depending on the types of used film-forming gases. That is, the central heater 21 serving as a heating part may be omitted as long as film formation is enabled. That is, the stage 2 needs not be heated. Meanwhile, as described above, in order to enable the film-forming process to be quickly started by suppressing the temperature of the stage 2 from being increased due to the transfer of heat from the wafer W during the annealing process, it is desirable to provide the flow path 22 constituting the cooling part of the stage 2.

Next, with reference to FIG. 10, a substrate processing apparatus 80, which is a first modification of the substrate processing apparatus 1, will be described with a focus on differences from the substrate processing apparatus 1. The substrate processing apparatus 80 is not provided with the peripheral lamp heater 44, and thus the wafer W is heated by light irradiation only from the central lamp heater 43 during the annealing process. A first reflection member 82 is provided on the central lamp heater 43. The first reflection member 82 is connected to a rotation mechanism 81 serving as a movement mechanism so as to be rotatable about a vertical axis. A second reflection member 83, which has a ring shape when viewed in a plan view, is provided above the peripheral portion of the stage 2 so as to surround the first reflection member 82 from the side. In addition, a laser light irradiation part 84 capable of radiating light independently of the central lamp heater 43 is provided above the first reflection member 82, and radiates laser light toward the first reflection member 82. A combination of the rotation mechanism 81, the first reflection member 82, the second reflection member 83, and the laser light irradiation part 84 constitutes a second light irradiation part.

The straight line arrows in FIG. 10 indicate the optical path of the laser light radiated from the laser light irradiation part 84. The laser light radiated onto the first reflection member 82 is reflected in the lateral direction and is radiated onto the second reflection member 83. The second reflection member 83 reflects the laser light downward. The laser light passes through the window 41 so as to be radiated on the position regulation portion 25 of the stage 2. With the rotation of the first reflection member 82, the direction of the laser light reflected by the first reflection member 82 is changed, and the position where the laser light is radiated moves in the circumferential direction of the second reflection member 83. With the movement of the radiation position on the second reflection member 83, the position where the laser light is radiated moves in the circumferential direction of the position regulation portion 25, and cleaning is performed over e entire circumference of the position regulation portion 25. Instead of configuring the first reflection member 82 to be rotatable relative to the stage 2, the stage 2 may be configured to be rotatable so as to move the position on the stage 2 where the laser light is radiated along the position regulation portion 25. That is, it is only necessary that the first reflection member 82 and the second reflection member 83 are movable relative to the stage 2.

Figure 11:
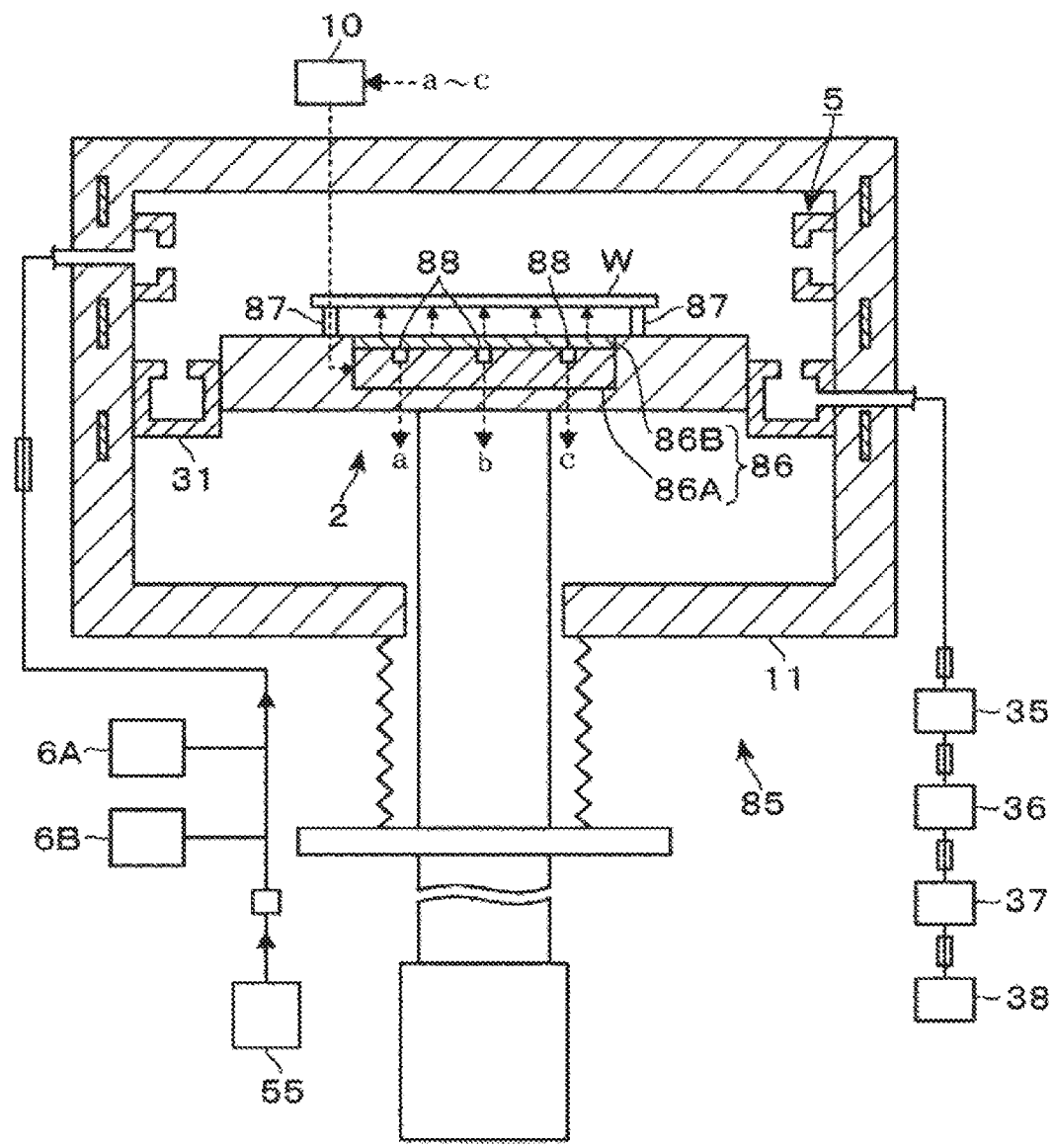
FIG. 11 is a view schematically illustrating a second modification of substrate processing apparatus.

FIG. 11 illustrates a substrate processing apparatus 85, which is a second modification of the substrate processing apparatus 1. The substrate processing apparatus 85 will be described with a focus on differences from the substrate processing apparatus 1. The stage 2 of the substrate processing apparatus 85 is provided with a light emitting diode (LED) 86 as a light source constituting a heating part. In addition, a plurality of pins 87 are provided on the stage 2. A rear surface of the wafer W is supported by the pins to be spaced apart from the LED 86 serving as a heating part. Annealing is performed by performing light irradiation from the LED 86 so as to heat the wafer W, instead of performing light irradiation from the lamp heater 42. Even in the apparatus configured as above, the LED 86 serving as a heat source heats the wafer W in a non-contact manner to perform the annealing process. Thus, the temperature of the wafer W is hardly affected by the LED 86 in performing the next film-forming process. Therefore, like the substrate processing apparatus 1, it is possible to quickly start the film-forming process after the annealing process, thus improving throughput. For example, the LED 86 includes a light source body 86A and a window 86B configured to transmit light emitted from the light source body 86A upward. In addition, a plurality of non-contact type thermometers 88 are provided below the window 86B. During the annealing process, a front surface of the window 86B is heated by the light from the light source body 86A, so that a polyurea film 73 formed on the window 86B is removed. As in the case of the substrate processing apparatus 1, it is possible to detect the temperatures of a plurality of portions of the wafer W. Then, based on the detected temperatures, the output of the LED 86 (the light intensity of the light source body 86A) is adjusted such that the temperature of the wafer W reaches a set temperature.

As illustrated as the examples of the substrate processing apparatuses described above, the heating part serving as a heat source for heating the wafer W in a non-contact manner may be configured by a lamp, and the lamp may be an LED. In addition, instead of providing the light irradiation part 4 on the ceiling of the processing container 11 in the substrate processing apparatus 1, a heating element having a heater resistor may be provided as a heating part, and the wafer W may be heated in a non-contact manner by radiant heat from the heating element. Even in the apparatus configured as above, the temperature of the wafer W which is to be subjected to the film-forming process after the annealing process is hardly affected by the temperature of the heating element. It is therefore possible to quickly start the film-forming process. Accordingly, the heating part for heating the wafer W may be a heating element that is heated by resistor.

In addition, the techniques described herein are not limited to the embodiments described above, and various modifications, omissions, and substitutions can be made within the scope of the gist the present disclosure.

For example, in the above-described embodiment, the example in which polyurea is used as a material of an organic film to be formed on the wafer W has been described, but other organic materials may be used as long as they are thermally-decomposable organic materials. Examples of the thermally-decomposable organic material other than polyurea may include polyurethane, acrylic resin, polyolefin, polycarbonate, polyamide, phenol resin, and a thermally-vaporizable low-molecular material. Accordingly, even if a polymer other than polyurea is used, it is possible to form an organic film. In addition, for example, H6XDA and H6XDI have been illustrated as examples of materials for forming the polyurea film 73. However, without being limited to using these materials, the polyurea film 73 may be formed using, for example, another known material.

(Evaluation Tests)

Next, evaluation tests performed in relation to the embodiments described above will be described.

(Evaluation Test 1)

Evaluation Test 1 was conducted, as described in the above embodiment, to perform the annealing process of heating the wafer W to remove the surface portion of the polyurea film. That is, the poly urea film was removed without exposing the wafer W to plasma. The temperatures of the wafers W during processing were changed for each wafer W. Then, the removal rate of the polyurea film 73 (the removed thickness of the polyurea film/the processing time) was calculated for each wafer W after processing. In addition, Comparative Test 1 was conducted in which an argon gas and an oxygen gas were supplied into the processing container, these gases were formed into plasma, and the surface portion of the polyurea film formed on the front surface of each wafer W was etched in a vacuum atmosphere. Even in Comparative Test 1, as in Evaluation Test 1, processing was performed while changing the temperature for each wafer W. Then, the removal rate (etching rate) of the polyurea film was calculated for each wafer W after the processing.

Figure 12:
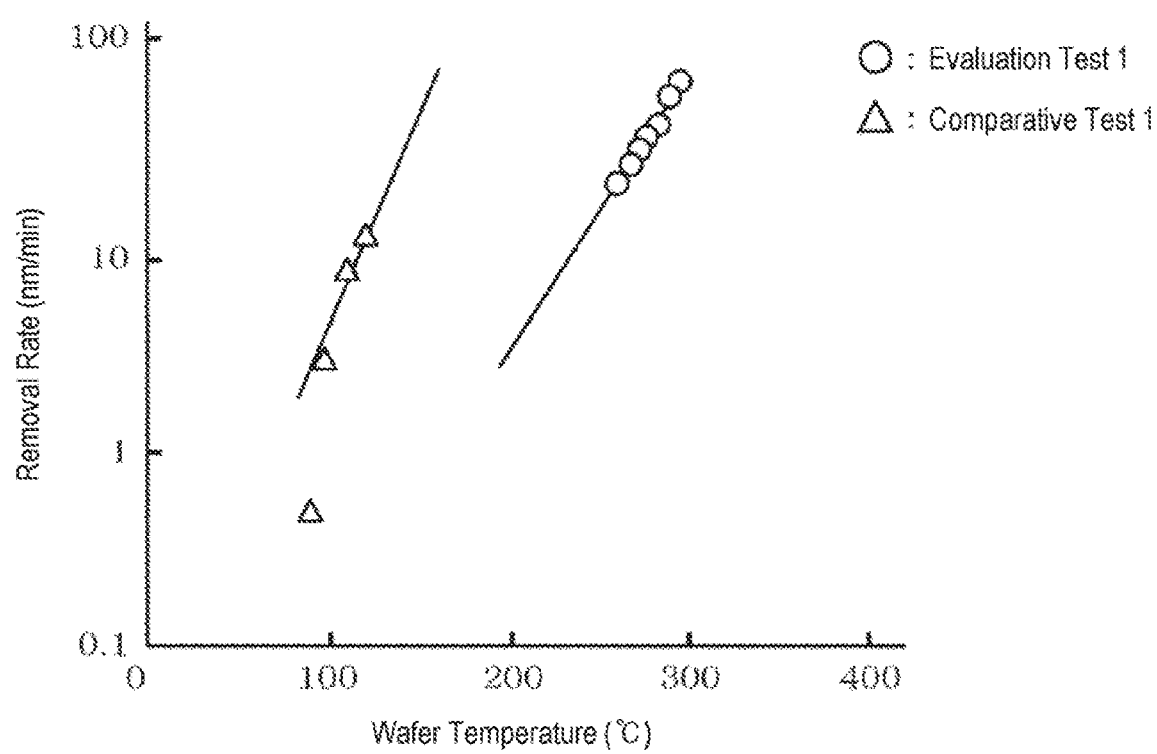
FIG. 12 is a graph representing a result of an evaluation test.

The test results of Evaluation Test 1 are shown in a graph of FIG. 12. The horizontal axis of the graph represents the temperature of the wafer W (unit: degrees C.), and the vertical axis of the graph represents the removal rate (unit: nm/min) of the polyurea film. In the graph, the results of Evaluation Test 1 and Comparative Test 1 are plotted, respectively, and the approximate straight lines created based on the results of Evaluation Test 1 and Comparative Test 1 are respectively indicated.

It can be seen from the approximate straight lines that, in order to obtain a similar removal rate between the removal technique of the present embodiment and the removal technique using plasma etching, it is necessary to set the temperatures of the wafers W to be higher in the removal technique of the present embodiment. However, there is no significant difference in the slopes of the approximate straight lines. That is, between the removal technique of the present embodiment and the removal technique using plasma etching, when the amount of change in temperature is the same, the amount of change in the removal rate is also the same. Accordingly, with respect to the controllability of the removal rate, it can be seen that there is no significant difference between the removal technique of the present embodiment and the removal technique using plasma etching.

(Evaluation Test 2)

Evaluation Test 2 was conducted in which the same processing as the annealing process of the substrate processing apparatus 1 was performed using a test apparatus to remove the surface portion of the polyurea film formed on the front surface of each wafer W, and then the thickness of the polyurea film remaining on the wafer W was measured. On the wafers W, polyurea films were formed so as to have film thicknesses of 50 nm, 100 nm, 200 nm, and 500 nm, respectively. Tests performed on the wafers W having the film thicknesses of 50 nm 100 nm, 200 nm, and 500 nm are referred to as Evaluation Tests 2-1, 2-2, 2-3, and 2-4, respectively. In these Evaluation Tests 2-1 to 2-4, the temperatures of the wafers W during processing were changed for each water W, and the changed range was 260 degrees C. to 300 degrees C.

Figure 13:
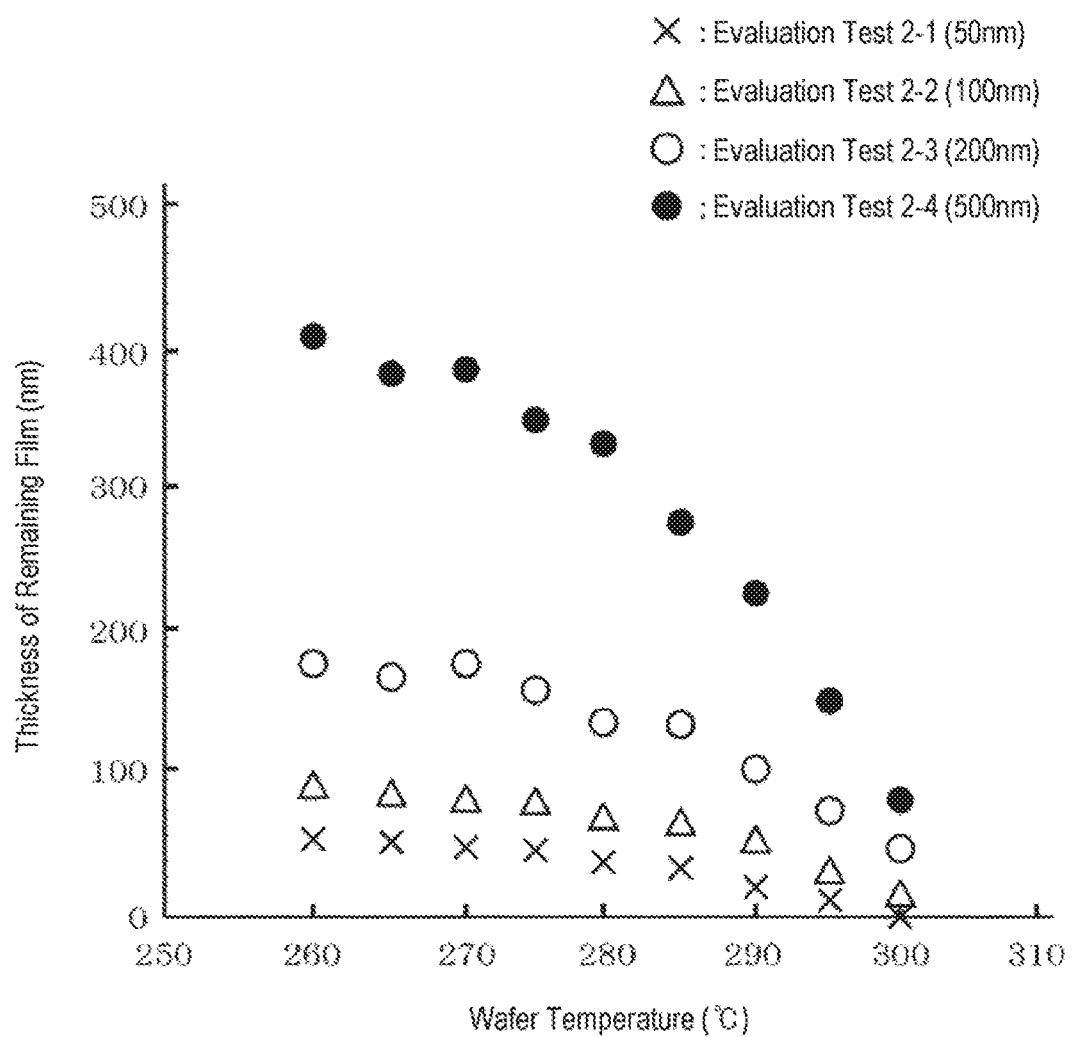
FIG. 13 is a graph representing a result of an evaluation test.

The graph of FIG. 13 shows the results of Evaluation Test 2. The horizontal axis of the graph represents the temperature (unit: degrees C.) of the wafer W, and the vertical axis of the graph represents the removed film thickness (unit: nm) of the surface portion. This graph shows that, in Evaluation Tests 2-1 to 2-4, the higher the temperature in the range of 260 degrees C. to 300 degrees C., the smaller the thickness of the remaining polyurea film, and that as the temperature of each wafer W increases, the difference in the remaining film thickness becomes smaller among Evaluation Tests 2-1 to 2-4. Accordingly, it can be seen that, since it is possible to adjust the remaining amount of the poly urea film 73 of each film thickness after the annealing process according to the temperature of each wafer W, it is possible to remove only a portion of the poly-urea film 73 by performing the annealing process, as described in the above-described embodiments.

(Evaluation Test 3)

As in the above-described embodiments, Evaluation test 3 was conducted in which the polyurea film 73 was formed on the front surface of the wafer W having the layer 71 in which the concave portions 72 forming a pattern are formed, and an image of the cross section of the wafer W acquired. This film-forming process was performed such that the film thickness becomes 100 nm. After the film-forming process, the surface portion of the polyurea film 73 was removed by performing the annealing process for heating the wafer W to 290 degrees C., and an image of the cross section of the water W was acquired. The film-forming process, the annealing process, and the acquisition of the cross-sectional images before and after the annealing process were performed on the plurality of wafers W having the same depth of concave portions 72 and different half pitches of patterns. The half pitches were 40 nm, 80 nm, 120 nm, 150 nm, 200 nm, 250 nm, and 300 nm, respectively.

Figure 14:
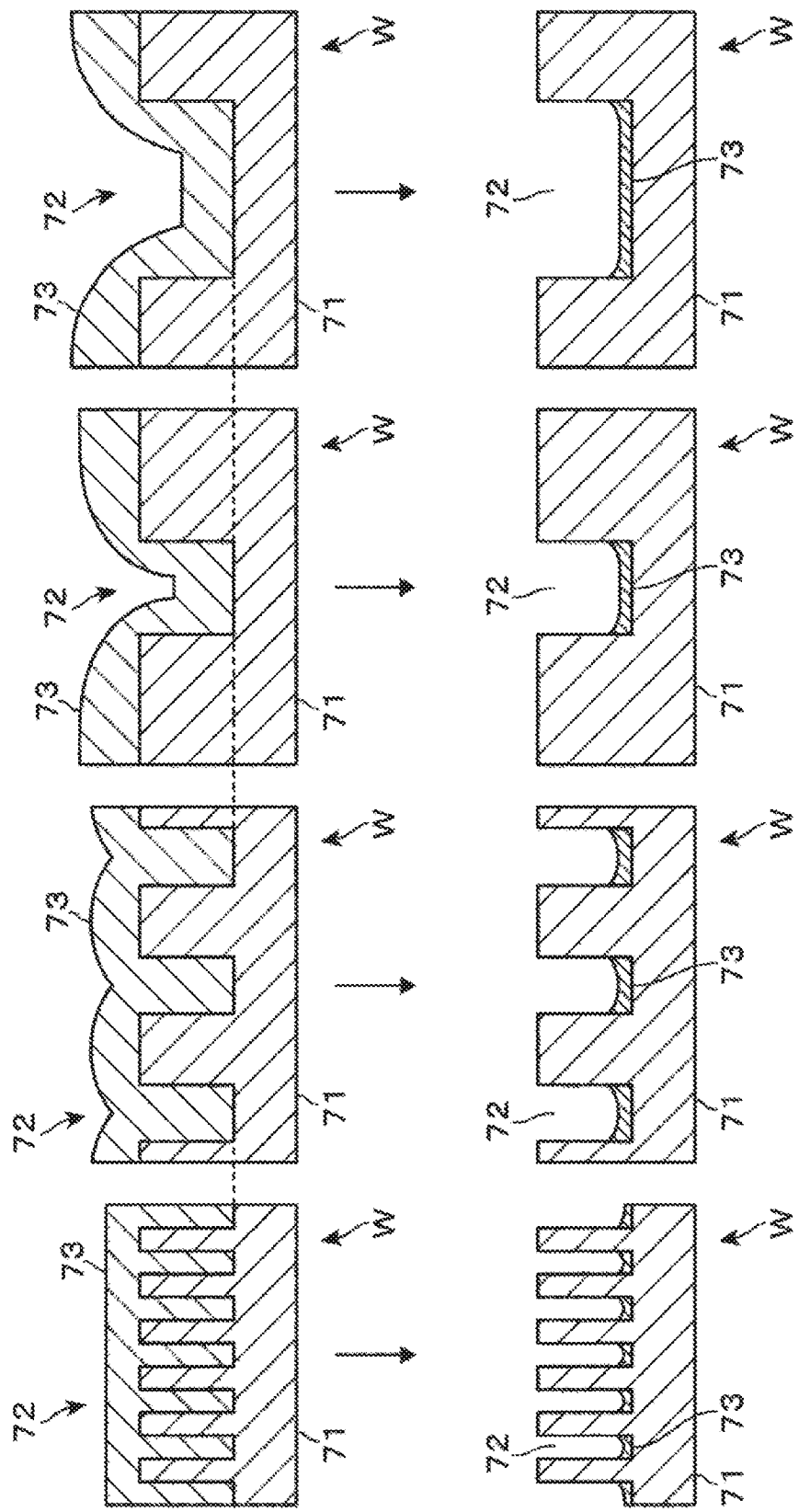
FIG. 14 is a view schematically illustrating cross-sections obtained from images of a wafer acquired in an evaluation test.

FIG. 14 is a view schematically illustrating the acquired images. Schematic diagrams obtained from images acquired for wafers W having half pitches of 40 nm, 120 nm, 200 nm, and 300 nm are shown from left to right in a side-by-side manner. Upper and lower stages of FIG. 14 show the wafers W before the annealing process and the wafers W after the annealing process, respectively. The illustration of the wafers W having half pitches of 80 nm, 150 nm, and 250 nm is omitted. For the wafers W before the annealing process, the result was obtained in which the larger the half pitch, the larger the height between the bottom surface of each concave portion 72 and the front surface of the polyurea film 73 outside each concave portion 72. In FIG. 14, the height of the bottom surface of each concave portion 72 of the wafers W before the annealing process is indicated by a dotted line. For the wafers W after the annealing process, the result was obtained in which the thicknesses of the polyurea films 73 in the concave portions 72 were substantially the same among the waters W, and the poly urea films 73 outside the concave portions 72 were removed, and thus the front surfaces of the layers 71 were exposed.

Accordingly, it can be seen that even if the front surface heights of the polyurea films 73 seen from the bottom surfaces of the concave portions 72 before the annealing process are different from each other, the thicknesses of the polyurea films after the annealing process can be made uniform. From the result of Evaluation Test 3, it can be seen that it is possible to make the polyurea film 73 remain by performing the processing cycle described in the embodiment regardless of the width of the concave portion 72. Since the polyurea film 73 remains in the concave portion 72 in one processing cycle as described above, it is considered that it is possible to deposit the polyurea film 73 on the concave portion 72 by repeating the processing cycle as described in the embodiment.

(Evaluation Test 4)

Evaluation Test 4 (Evaluation Tests 4-1 to 4-8) was conducted in which XPS (X-ray photoelectron spectroscopy) was performed on the front surface of each of a substrate that was subjected to various kinds of processing including formation of a polyurea film on the front surface and a silicon substrate that was not subjected to processing, and the photoelectric emission intensity of C1s was measured. Hereinafter, Evaluation Tests 4-1 to 4-8 will be described in detail. In Evaluation Test 4-1, a measurement was performed on the front surface of a bare silicon substrate that was not subjected to the above-described processing. In Evaluation Test 4-2, a measurement was performed on the front surface of the substrate by performing a film-forming process of forming a polyurea film on the substrate such that the film thickness of the polyurea film becomes 150 nm, and subsequently performing an annealing process of heating the substrate at 350 degrees C. for 5 minutes in a $N_2$ gas atmosphere. In Evaluation Tests 4-3 to 4-8, measurements were performed on the front surfaces of substrates which were processed in the same manner as in Evaluation Test 4-2 except that the substrates were exposed to plasma after the film-forming process and before the annealing process. The gases for generating plasma are different among Evaluation Tests 4-3 to 4-8. In Evaluation Tests 4-3, 4-4, 4-5, 4-6, 4-7, and 4-8, plasma was generated using an Ar (argon) gas, an $O_2$ (oxygen) gas, $CO_2$ (carbon dioxide) gas, a mixture gas of a $H_2$ (hydrogen) gas and a $N_2$ gas, a $CF_4$ (methane tetrafluoride) gas, and a $C_4F_8$ (octafluorocyclobutane) gas, respectively.

Figure 15:
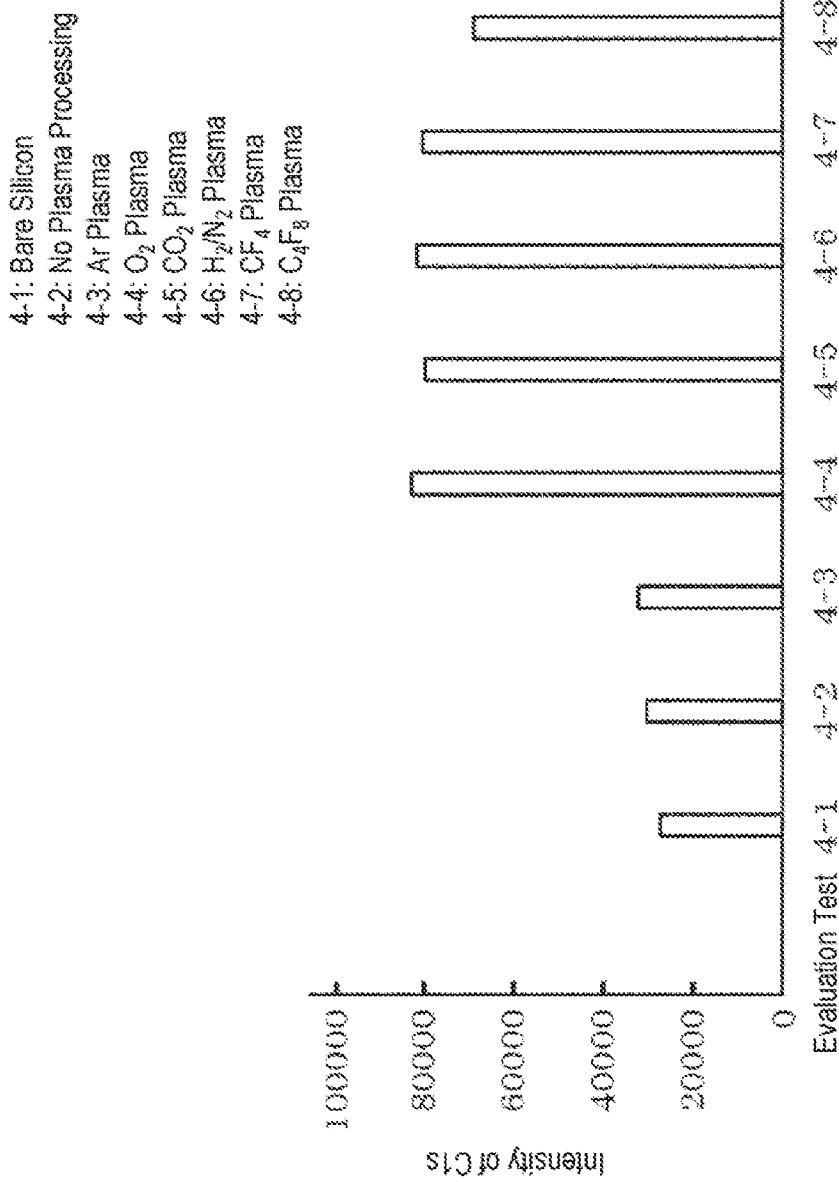
FIG. 15 is a graph representing a result of an evaluation test.

The bar graph of FIG. 15 shows the results of Evaluation Test 4. The vertical axis of the graph represents the measured intensity of C1s. There is no significant difference in the intensity of C1s between Evaluation Test 4-1 in which the bare silicon substrate was used, and Evaluation Test 4-2 in which the substrate was subjected to the annealing process but not subjected to the plasma processing. As shown in the graph, the intensity of C1s in Evaluation Test 4-3 using the plasma of Ar gas is slightly greater than the intensity of C1s in Evaluation Test 4-2. The intensity of C1s in Evaluation Tests 4-4 to 4-8 using various plasmas is significantly higher than that in Evaluation Test 4-2. It is believed that the intensity of C1s in Evaluation Tests 4-3 to 4-8 in which the substrates were exposed to plasma was high due to the fact that compounds that are not removed by the annealing process were generated since the modification of the polyurea film occurred as described above. From the result of this Evaluation Test 4, it has been shown that the above-described embodiment, in which the polyurea film is removed without being exposed to plasma after the film-forming process of the polyurea film, is effective because it is possible to suppress the modification of the polyurea film and to reduce the residue.

(Evaluation Test 5)

Evaluation Test 5 was conducted in which the polyurea film was formed by heating the wafer W and supplying the film-forming gas, and a deposition rate (thickness of the polyurea film/film formation in the processed wafer W was calculated. Processing was performed on the plurality of wafers W, and the temperatures of the wafers W during the film-forming process was changed for each water W within the range of 80 degrees C. to 95 degrees C.

Figure 16:
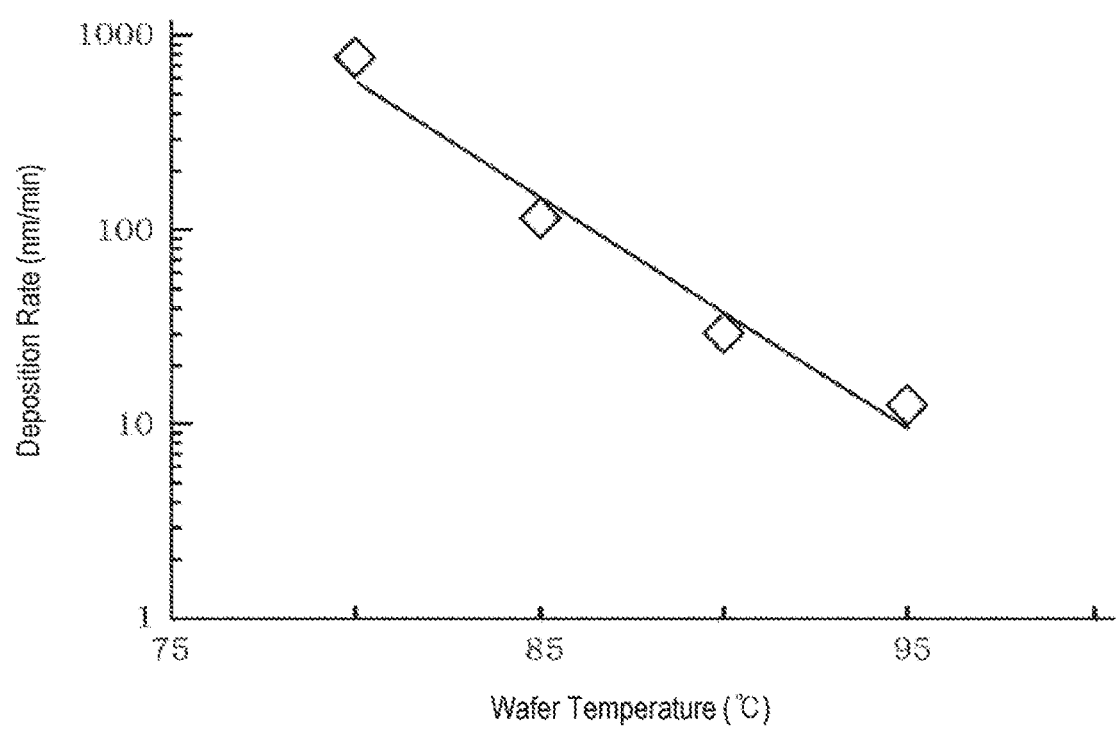
FIG. 16 is a graph presenting a result of an evaluation test.

The single logarithmic graph in FIG. 16 shows the result of Evaluation Test 5. The vertical axis of the graph represents the deposition rate (unit: nm min), and the horizontal axis represents the temperature of the wafer W (unit: degrees C.). As shown in the graph, when the temperatures of the wafers W are 80 degrees C., 85 degrees C., 90 degrees C., and 95 degrees C., the deposition rates are about 800 nm/min, 110 nm/min, 30 nm/min, and 12 nm/min, respectively. Such relatively small changes in temperature cause relatively large changes in deposition rate. Accordingly, from Evaluation Test 5, it has been confirmed that, by increasing the temperature of each member within the processing container compared with the temperature of the wafer W as described in the embodiment, it is possible to efficiently form the polyurea film on the wafer W and substantially suppress the polyurea film from being formed on each member within the processing container.

According to the present disclosure in some embodiments, it is possible to provide an apparatus and a technique capable of improving throughput in forming an organic film on a substrate and removing a surface portion of the organic film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
   a processing container having a vacuum atmosphere formed therein;
   a stage provided within the processing container and configured to place a substrate on the stage;
   a film-forming gas supply part configured to supply a film-forming gas for forming an organic film on the substrate placed on the stage; and
   a heating part configured to heat the substrate placed on the stage in a non-contact manner so as to remove a surface portion of the organic film, wherein the heating part is a light irradiation part configured to irradiate the substrate with light so as to heat the substrate.

2. The substrate processing apparatus of claim 1, further comprising:
   a controller configured to output a control signal such that a processing cycle is repeatedly performed on the substrate, the processing cycle including the supply of the film-forming gas to the substrate by the film-forming gas supply part, and the irradiation of the light to the substrate by the heating part, which follows the supply of the film-forming gas to the substrate.

3. The substrate processing apparatus of claim 2, further comprising:
a cleaning mechanism configured to remove the organic film formed on a portion outside a substrate placement area of the stage when the substrate is not placed on the stage.

4. The substrate processing apparatus of claim 3, wherein the light irradiation part includes a first light irradiation part configured to irradiate the substrate placement area with the light, and
wherein the cleaning mechanism includes a second light irradiation part configured to irradiate the portion outside the substrate placement area with the light so as to heat the portion, the second light irradiation part being operated independently of the first light irradiation part.

5. The substrate processing apparatus of claim 2, wherein the second light irradiation part includes:
a laser light irradiation part configured to irradiate a laser light;
a reflection member configured to reflect the laser light such that the laser light is irradiated onto a peripheral portion of the stage; and
a movement mechanism configured to relatively move the reflection member with respect to the stage such that an irradiation position of the laser light moves along the peripheral portion of the stage.

6. The substrate processing apparatus of claim 5, wherein the light irradiation part includes:
a light source; and
a light guide member configured to transmit therethrough the light irradiated from the light source such that the light is supplied to the substrate, the light guide member forming an inner wall surface of the processing container, and
the substrate processing apparatus further comprises a light guide member heating part configured to heat the light guide member.

7. The substrate processing apparatus of claim 6, wherein, when the film-forming gas supply part supplies the film-forming gas, the light guide member heating part heats the guide member such that the light guide member has a temperature higher than a temperature of the substrate.

8. The substrate processing apparatus of claim 7, wherein, when the substrate is irradiated with the light, by heat stored in the light guide member by absorbing the light irradiated from the light source and the heating performed by the light guide member heating part, the light guide member is at a temperature at which the organic film is depolymerized.

9. The substrate processing apparatus of claim 8, further comprising:
a cooling part configured to cool down the stage when the light irradiation part irradiates the substrate with light.

10. The substrate processing apparatus of claim 9, wherein the organic film is a polymer.

11. The substrate processing apparatus of claim 10, wherein the polymer is a polymer having a urea bond.

12. The substrate processing apparatus of claim 1, further comprising:
a cleaning mechanism configured to remove the organic film formed on a portion outside a substrate placement area of the stage when the substrate is not placed on the stage.

13. The substrate processing apparatus of claim 1, wherein the organic film is a polymer.

14. The substrate processing apparatus of claim 1, wherein the light irradiation part includes:
a light source; and
a light guide member configured to transmit therethrough the light irradiated from the light source such that the light is supplied to the substrate, the light guide member forming an inner wall surface of the processing container, and
the substrate processing apparatus further comprises a light guide member heating part configured to heat the light guide member.

15. The substrate processing apparatus of claim 1, further comprising:
a cooling part configured to cool down the stage when the light irradiation part irradiates the substrate with light.

* * * * *